(12) United States Patent
Fujimori et al.

(10) Patent No.: US 7,456,701 B2
(45) Date of Patent: Nov. 25, 2008

(54) FLEXIBLE SUBSTRATE AND ELECTRONIC EQUIPMENT

(75) Inventors: Keitaro Fujimori, Suwa (JP); Mihiro Nonoyama, Suwa (JP); Yukinari Shibata, Suwa (JP); Yoshiteru Ono, Suwa (JP); Hiroyasu Honda, Suwa (JP); Yoshiro Iwasa, Suwa (JP)

(73) Assignee: Seiko Epson Corporation (JP)

( * ) Notice: Subject to any disclaimer, the term of this patent is extended or adjusted under 35 U.S.C. 154(b) by 616 days.

(21) Appl. No.: 11/077,392

(22) Filed: Mar. 10, 2005

(65) Prior Publication Data
US 2005/0200413 A1 Sep. 15, 2005

(30) Foreign Application Priority Data
Mar. 12, 2004 (JP) ............... 2004-070990

(51) Int. Cl.
*G06F 13/00* (2006.01)
*H03H 7/38* (2006.01)
(52) U.S. Cl. .............. 333/33; 710/100; 710/305; 370/464; 370/912; 709/253
(58) Field of Classification Search ............ 333/33; 710/100, 305; 370/464, 912; 709/253
See application file for complete search history.

(56) References Cited
U.S. PATENT DOCUMENTS
6,318,909 B1 * 11/2001 Giboney et al. ............ 385/90
6,856,715 B1 * 2/2005 Ebbesen et al. ............ 385/14
6,879,032 B2 * 4/2005 Rosenau et al. ............ 257/696
6,952,565 B1 * 10/2005 Takeda et al. .............. 455/84
7,145,413 B2 * 12/2006 Hsu et al. .................. 333/33
7,266,629 B2 * 9/2007 Honda ....................... 710/305
7,304,863 B1 * 12/2007 Wu ............................ 361/780
2006/0034326 A1 * 2/2006 Anderson et al. .......... 370/466

FOREIGN PATENT DOCUMENTS

| JP | 03-073587 | 3/1991 |
|----|-----------|--------|
| JP | 04-240994 | 8/1992 |
| JP | 05-0272697 | 2/1993 |
| JP | 09-083233 | 3/1997 |
| JP | 11-186674 | 7/1999 |
| JP | 2001-007458 | 1/2001 |
| JP | 2002-222578 | 8/2002 |
| JP | 2002-354053 | 12/2002 |
| JP | 2003-124579 | 4/2003 |

* cited by examiner

*Primary Examiner*—Barbara Summons
(74) *Attorney, Agent, or Firm*—Harness, Dickey & Pierce, P.L.C.

(57) ABSTRACT

A flexible substrate including: a first part provided with a first device DV1; a second part provided with a second device; a wiring part placed between the first part and the second part and including a plurality of wirings for coupling the first device and the second device; the first device including at least a first data transfer control unit, the second device including at least a second data transfer control unit, the first data transfer control unit and the second data transfer control unit transferring data by using a differential signal, and the plurality of wirings for coupling the first device and the second device including at least one differential signal line pair for transferring data by using a differential signal.

18 Claims, 20 Drawing Sheets

FLEXIBLE SUBSTRATE AND ELECTRONIC EQUIPMENT

RELATED APPLICATIONS

This application claims priority to Japanese Patent Application No. 2004-070990 filed Mar. 12, 2004 which is hereby expressly incorporated by reference herein in its entirety.

BACKGROUND

1. Technical Field

The present invention relates to a flexible substrate and electronic equipment.

2. Related Art

As the resolution of a display panel built in small-sized electronic equipment increases, the need increases for transmitting signals at high frequencies among circuits included in the electronic equipment. There arises the problem of signal reflection among a circuit that transfers high-frequency signals to transmit the signals, a transmission channel that transmits high-frequency signals, and a circuit that receives high-frequency signals. The signal reflection is caused by impedance differences among the circuits and transmission channel, and causes signal degradation and unnecessary radiation.

Japanese Unexamined Patent Application Publication No. 9-83233 describes a portable radio terminal with its sensitivity enhanced by cutting unnecessary radiation in transmitting high-frequency signals. The portable radio terminal shown in FIG. 8A of 9-83233 has a ground layer on the surface of a flexible substrate coupling a high-frequency circuit and a base band circuit, in order to cut unnecessary radiation with the ground layer acting as a shield. Accordingly, while the sensitivity of the portable radio terminal increases, impedance matching is not achieved among the input-output impedance of the high-frequency circuit, the characteristic impedance of wirings on the flexible substrate, and the input-output impedance of the base band circuit. Therefore, it is difficult to transmit signals at higher frequencies. Impedance matching among various media coupling the high-frequency circuit, the flexible substrate, and the base band circuit in the circuitry described in 9-83233 could largely increase design cost, which is unpractical.

Japanese Unexamined Patent Application Publication No. 2002-354053 describes a signal transmission cable fitted with impedance parts on both sides of its differential signal transmission channel, which transmits differential signals. This structure aims to improve the characteristics of differential signals. However, in order to prevent signal reflection between a circuit for transmitting differential signals and a circuit for receiving differential signals, it is necessary to get the output impedance of the circuit transmitting differential signals and the input impedance of the circuit receiving differential signals matched to the terminal impedance of the signal transmission cable described in 2002-354053. This impedance matching makes the design of the circuits for transmitting and receiving differential signals complicated and keeps cost high, resulting in cost increases even with economical cables. Moreover, extra impedance parts added to the transmission channel can increase the amount of power consumption. Therefore, such a cable is not preferably applicable to portable electronic equipment, in particular.

Japanese Unexamined Patent Application Publication No. 5-27697 below also describes a method for cutting unnecessary radiation by means of impedance matching. However, in order to cut signal reflection at both ends of a transmission channel through which high-frequency signals are transmitted, the structure disclosed by 5-27697 requires impedance matching among circuits coupled to the both ends of the transmission channel, which keeps the cost of design high.

In consideration of the above-mentioned technical issues, the present invention is intended to provide a flexible substrate that is highly cost effective and capable of cutting signal reflection in transmitting high-frequency signals and transferring serial data at high speed with little signal degradation, and also to provide electronic equipment including the flexible substrate.

SUMMARY

The present invention relates to a flexible substrate, on which a device is mounted, including: a first part provided with a first device; a second part provided with a second device; and a wiring part placed between the first part and the second part and including a plurality of wirings for coupling the first device and the second device; the first device including at least a first data transfer control unit, the second device including at least a second data transfer control unit, the first data transfer control unit and the second data transfer control unit transferring data by using a differential signal, and the plurality of wirings included in the wiring part for coupling the first device and the second device including at least one differential signal line pair for transferring data by using a differential signal.

According to the present invention, the flexible substrate including the first device, the second device, and the wiring part reduces signal degradation with few portions causing signal reflection between the first device and the second device, and thereby transferring differential signals via the differential signal line pair at high speed. Since the wiring part is provided in the flexible substrate, it is possible to largely reduce cost for manufacturing the wirings for coupling the first device and the second device, compared to using wirings such as coaxial cables to couple the first device and the second device.

According to the present invention, assuming that a direction in which the plurality of wirings for coupling the first device and the second device extend is a first direction, the wiring part may include a first conductor extending in the first direction in a lower layer of the wiring part, an insulator extending in the first direction in a higher layer than the first conductor, and the plurality of wirings provided on the insulator.

This structure of the wiring part reduces the effect of unnecessary radiation in transmitting differential signals on other devices. It is also possible to prevent the effect of unnecessary radiation etc., (such as signal degradation in transmitting differential signals) from other devices on the wiring part. Therefore, it is possible to transmit signals at high speed with little signal degradation.

According to the present invention, characteristic impedance determining parameters for determining the characteristic impedance of a first differential signal line and a second differential signal line included in the differential signal line pair may include the wiring width, wiring thickness, and wiring length of the first differential signal line and the second differential signal line, and the thickness and dielectric constant of the insulator; and at least one of the characteristic impedance determining parameters of the first differential signal line and the second differential signal line may be set so as to match the characteristic impedance of the first differential signal line and the second differential signal line and the input-output impedance of at least one of the first device and the second device.

According to the present invention, the characteristic impedance of the wiring part can be matched to the impedance of the first device and the second device by adjusting the characteristic impedance determining parameters. In other words, it is possible to freely lay out the shape of the wiring part for various purposes by adjusting the characteristic impedance determining parameters after setting the shape of the wiring part.

According to the present invention, the plurality of wirings may include the differential signal line pair in a plural number, the differential signal line pair provided in a plural number may be provided on the insulator, and a second conductor may extend in the first direction between the differential signal line pair provided in a plural number on the insulator.

According to the present invention, the second conductor acts as a shield, and makes it possible to transmit signals while substantially retaining the quality of the signals in transferring serial data at higher speed.

According to the present invention, assuming that a direction in which the plurality of wirings for coupling the first device and the second device extend is a first direction, the wiring part may include a third conductor extending in the first direction in a lower layer of the wiring part, an insulator extending in the first direction in a higher layer than the third conductor, a fourth conductor extending on the insulator, and the plurality of wirings provided in the insulator.

According to the present invention, the third conductor acts as a shield, and the plurality of wirings are provided in the insulator. This structure enables the plurality of wirings provided in the wiring part to transmit signals at high speed with little signal degradation.

According to the present invention, the plurality of wirings may include the differential signal line pair in a plural number, assuming that a direction in which the plurality of wirings for coupling the first device and the second device extend is a first direction, the plurality of wirings may include the differential signal line pair in a plural number, an insulator may extend in the first direction in the wiring part, the plurality of wirings may be provided on the insulator, a second conductor may extend in the first direction between the differential signal line pair provided in a plural number on the insulator, and a plurality of signal lines other than the first differential signal line and the second differential signal line included in the differential signal line pair may be provided below the insulator on a side the plurality of wirings are not provided.

According to the present invention, the second conductor acts as a shield, and makes it possible to prevent signal degradation in transmitting differential signals. Also by providing a plurality of signal lines other than the first differential signal line and the second differential signal line included in the differential signal line pair on the side the plurality of wirings are not provided, it is possible to reduce the area of the wiring part. In other words, it is possible to increase the versatility of the layout of the wiring part, and thus decrease manufacturing cost.

According to the present invention, each of the plurality of signal lines may be wired to the insulator so as to be placed below the second conductor.

This structure makes it possible to prevent interference between the plurality of signal lines other than the first differential signal line and the second differential signal line included in the differential signal line pair and the differential signal line pair.

According to the present invention, at least one of the first device and the second device may include a variable input-output impedance circuit that makes the input-output impedance of at least one of the devices variable in accordance with the characteristic impedance of the differential signal line pair.

According to the present invention, by using the variable input-output impedance circuit, it is possible to match the impedance of the first device and the second device to various characteristic impedance of the wiring part. In other words, there is no need for manufacturing the first device or the second device for each of the wirings that have different characteristic impedance, and thereby decreasing manufacturing cost. Furthermore, it is possible to meet various characteristic impedance of the wiring part, and thus to increase the versatility of the layout of the wiring part.

According to the present invention, the variable input-output impedance circuit may include an impedance setting register in which impedance setting information is written, and the variable input-output impedance circuit may set the input-output impedance of at least one of the devices based on impedance setting information in the impedance setting register.

Thus, by inputting control signals etc. to the variable input-output impedance circuit, it is possible to set the input-output impedance of the first device or the second device based on impedance setting information stored in the impedance setting register.

According to the present invention, other devices than the data transfer control units may be integrated in at least one of the first device and the second device.

According to the present invention, the flexible substrate may further include: a first terminal coupled to a first device signal line that is coupled to the first device; and a second terminal coupled to a second device signal line that is coupled to the second device.

The present invention also relates to electronic equipment including: the above-mentioned flexible substrate; a first equipment part provided with the first part included in the flexible substrate; and a second equipment part provided with the second part included in the flexible substrate.

According to the present invention, it is possible to transfer large volumes of data between the first equipment part and the second equipment part via the differential signal line pair at high speed. Moreover, it is possible to reduce cost for manufacturing the electronic equipment.

According to the present invention, the electronic equipment further includes: an equipment coupling part for coupling the first equipment part and the second equipment part, the equipment coupling part provided with the wiring part included in the flexible substrate.

According to the present invention, since the wiring part included in the flexible substrate is flexible, and the wiring part is provided in the equipment coupling part, it is possible to increase the versatility of designing the shape of the equipment coupling part.

The present invention also relates to electronic equipment including: the flexible substrate provided with the first terminal and the second terminal; a first substrate coupled to the first terminal included in the flexible substrate; and a second substrate coupled to the second terminal included in the flexible substrate.

According to the present invention, it is possible to transfer data between the first substrate and the second substrate at high speed. Furthermore, since the electronic equipment includes the first substrate and the second substrate, it is possible to reduce cost for manufacturing electronic equipment capable of transferring data between substrates at high speed.

The present invention also relates to electronic equipment including: the flexible substrate provided with the first terminal and the second terminal; and a substrate provided with a coupling part coupled to the first terminal and another coupling part coupled to the second terminal.

According to the present invention, other wirings, etc., can be provided on or in the substrate, between the coupling part coupled to the first terminal and the coupling part coupled to the second terminal provided on the substrate. This is achieved since there is a space between the substrate and the differential signal line pair by providing the differential signal line pair in the wiring part of the flexible substrate. Accordingly, interference, etc., of the wiring part of the flexible substrate on other wirings provided on or in the substrate can be reduced. For the same reason, other devices, ICs, etc., can also be provided between the coupling part coupled to the first terminal and the coupling part coupled to the second terminal on the substrate. In other words, it is possible to increase the versatility of the layout of the substrate, and thereby efficiently using the area of the substrate.

DETAILED DESCRIPTION

An embodiment of the present invention will be described with reference to the accompanying drawings. The embodiment described below is not intended to unreasonably limit the present invention set forth in the claims. Also, the present invention may be practiced without some of the specific elements described below.

1. Flexible Substrate

Figure 1:
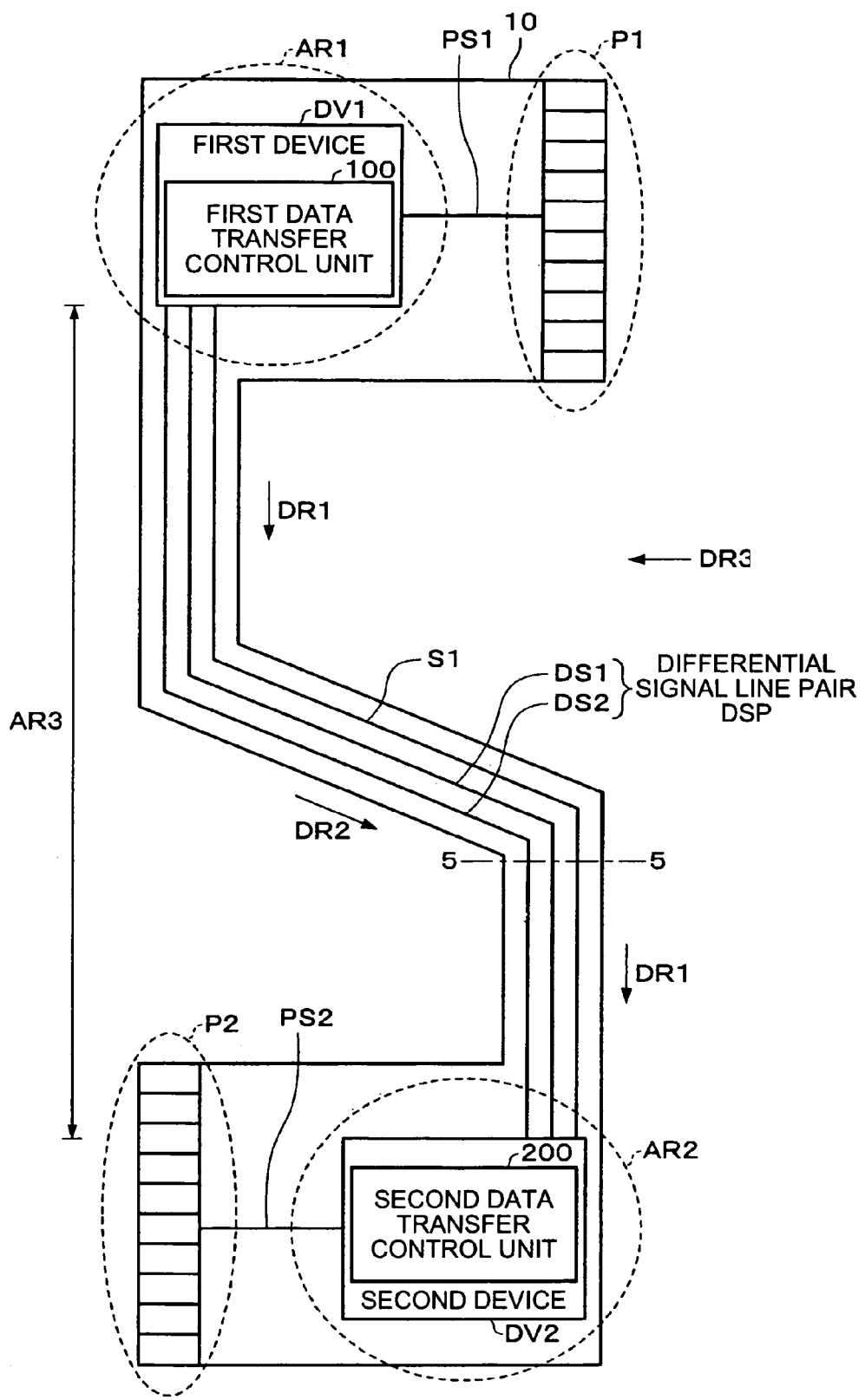
FIG. 1 is an overall view of a flexible substrate according to one embodiment of the present invention.

FIG. 1 is an overall view of a flexible substrate 10.

The flexible substrate 10 includes a first part AR1, a second part AR2, and a wiring part AR3. The first part AR1 includes a first device DV1, while the second part AR2 includes a second device DV2. The wiring part AR3 includes a plurality of wirings. The first part AR1, the second part AR2, and the wiring part AR3 are formed as a unit, for example.

The plurality of wirings include, for example, a differential signal line pair DSP and a signal line S1. The differential signal line pair DSP further includes a first differential signal line DS1 and a second differential signal line DS2. The first part AR1 also includes a first terminal P1 and a first device signal line PS1. The first terminal P1 is coupled to another substrate, for example. The first device signal line PS1 couples the first device DV1 and the first terminal P1. Meanwhile, the second part AR2 includes a second terminal P2 and a second device signal line PS2. The second terminal P2 is coupled to another substrate, for example. The second device signal line PS2 couples the second device DV2 and the second terminal P2.

Figure 5:
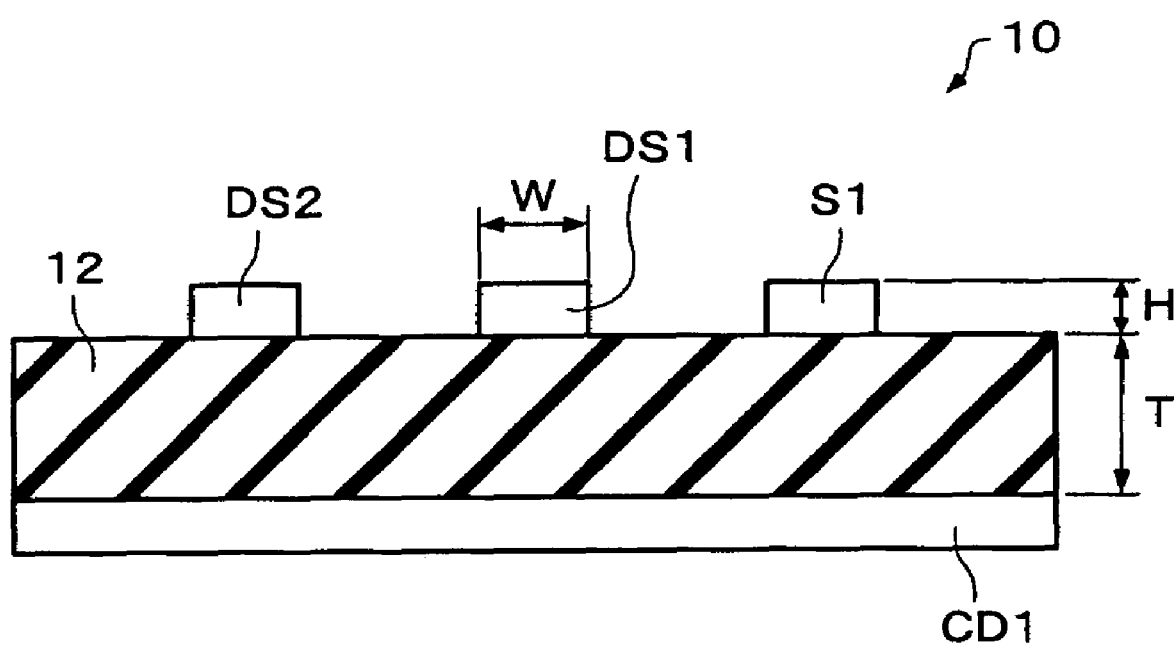
FIG. 5 is a sectional view of the wiring part shown in FIG. 1.

While the flexible substrate 10 shown in FIG. 1 is provided with the three signal lines, i.e. the first differential signal line DS1, the second differential signal line DS2, and the signal line S1, the number of the signal lines is not limited to this. The flexible substrate 10 may include the differential signal line pair DSP provided in a plural number and the signal line S1 provided in a plural number. Also, while the first device signal line PS1 and the second device signal line PS2 are represented as one line each in the drawing for simplifying the description, the number of the signal lines is not limited to this. Both of the first device signal line PS1 and the second device signal line PS2 may be provided in a plural number so as to meet the need for data transfer. It is noted that like numerals indicate like elements throughout the views. Along the line 5-5 in FIG. 1, FIG. 5 is a sectional view of the wiring part shown in FIG. 1.

The first device DV1 includes a first data transfer control unit 100. The second device DV2 includes a second data transfer control unit 200. The second data transfer control unit 200 produces serial data based on a signal input from the second terminal P2 via the second device signal line PS2, and transfers the serial data to the first data transfer control unit 100 via the differential signal line pair DSP at high speed. The first data transfer control unit 100 receives the serial data transferred via the differential signal line pair DSP, analyzes the serial data, and outputs an analysis result to the first terminal P1 via the first device signal line PS1.

Also, the second data transfer control unit 200 may receive serial data, while the first data transfer control unit 100 may transmit serial data. In this case, the above-mentioned process for transferring serial data is reversed. More specifically, the first data transfer control unit 100 produces serial data based on a signal input via the first device signal line PS1, and transfers the serial data to the second data transfer control unit 200 via the differential signal line pair DSP. Upon receiving the serial data, the second data transfer control unit 200 analyzes the serial data, produces a signal based on an analysis result, and outputs the signal to the second terminal P2 via the second device signal line PS2.

The wiring part of the flexible substrate 10 may include, but not be limited to, a part formed in the direction DR1 (referred to as a first direction in a broader sense) and a part formed in the direction DR2 (also referred to as the first direction in a broader sense) shown in FIG. 1. In the flexible substrate 10, the wiring part AR3 may be formed in a line along the direction DR1, for example. In other words, the part can be formed in various shapes depending on the shape of equipment to be mounted. The directions DR1 and DR2 shown in FIG. 1 are referred to as directions in which a plurality of wirings extend.

Figure 2:
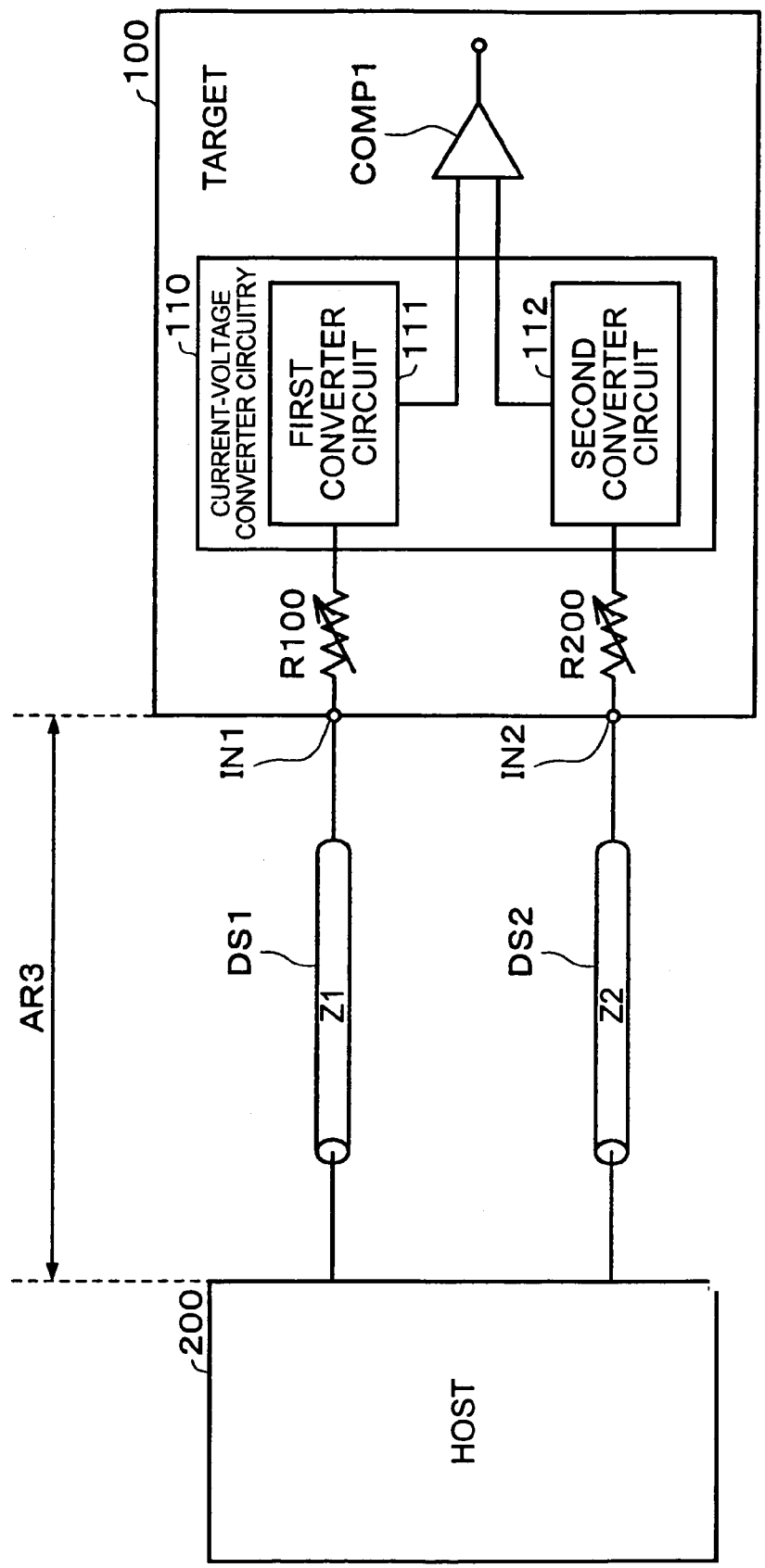
FIG. 2 is a block diagram schematically showing a first data transfer control unit, a second data transfer control unit, and a wiring part according to the present embodiment.

Referring to FIG. 2, the second data transfer control unit 200 serves as a host (a device that transmits data), and the first data transfer control unit 100 serves as a target (a device that receives data). The drawing shows the coupling of the first data transfer control unit 100, the second data transfer control unit 200, and the differential signal line pair DSP. The structure shown in FIG. 2 is simplified for convenience of explanation, and is not intended to limit the structure of the present invention.

Figure 3:
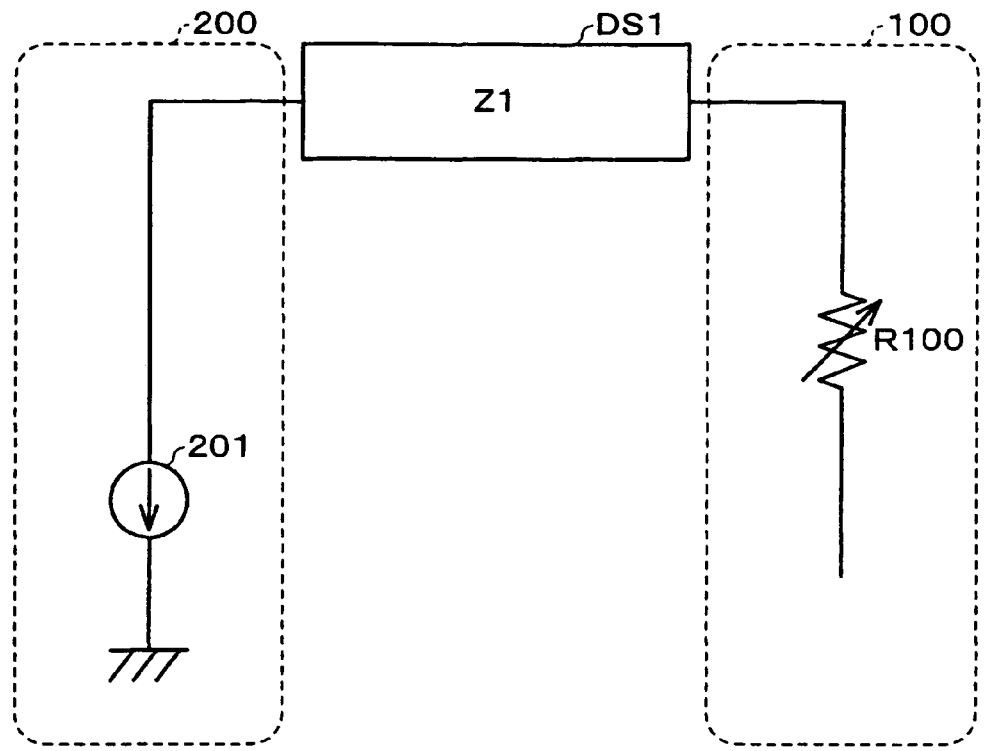
FIG. 3 is a view showing the coupling of the first data transfer control unit, a first differential signal line, and the second data transfer unit.

FIG. 3 is a more simplified view than FIG. 2, showing the coupling of the first data transfer control unit 100, the first differential signal line pair DS1, and the second data transfer control unit 200.

The first data transfer control unit 100 and the second data transfer control unit 200 shown in FIG. 2 transfer differential signals by a current driving method, for example. In this case, since the second data transfer control unit 200 (host) transfers differential signals with a constant current source 201 shown in FIG. 3, the output impedance of the host 200 increases infinitely. Signals transmitted from the host 200 in FIG. 2 via the first differential signal line DS1 and the second differential signal line DS2 included in the wiring part AR3 are converted to a voltage amplitude by a first converter circuit 111 and a second converter circuit 112 included in current-voltage converter circuitry 110. A comparator COMP1 receives converted signals, and then outputs a signal in accordance with voltage amplitude differences of each of the signals.

Coupled to a coupling point IN1 of the first data transfer control unit 100 (hereinafter also referred to as "the target") in FIG. 2 is the first differential signal line DS1. When transferring serial data and the like at high speed, signal reflection at the coupling point IN1 and a coupling point IN2 causes a problem. To prevent the reflection of transmitted signals, characteristic impedance Z1 of the first differential signal line DS1 and input impedance R100 of the target 100 are matched at the coupling point IN1. At the coupling point IN2 in the same manner, characteristic impedance Z2 of the second differential signal line DS2 and input impedance R200 of the target 100 are matched. For convenience of explanation, resistors are represented by symbols (e.g. R100, R200) used for referring to the resistance or impedance of the resistors.

The first data transfer control unit 100 and the second data transfer control unit 200 of the present embodiment can make the input impedance R100 and the input impedance R200 variable, which will be described in greater detail later. By making the input impedance R100 and the input impedance R200 variable, it is possible to flexibly match the characteristic impedance of the first differential signal line DS1 and the second differential signal line DS2 and the input-output impedance of the target 100. In other words, it is possible to freely lay out the shape of the wiring part AR3 shown in FIG. 1.

Figure 4:
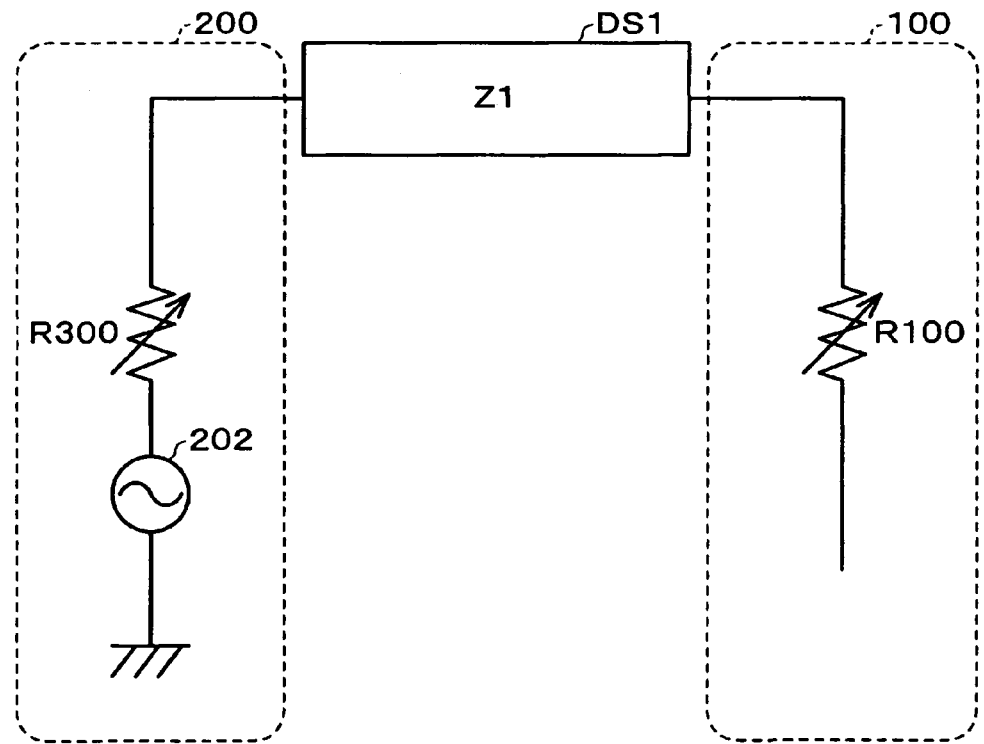
FIG. 4 is a view showing the coupling of the first and second data transfer control units and the first differential signal line, when the data transfer control units transfer differential signals by a voltage driving method.

FIG. 4 shows the coupling of the data transfer control units 100 and 200 and the first differential signal line pair DS1. The data transfer control units 100 and 200 shown here transfer differential signals by a voltage driving method.

The host 200 shown in FIG. 4 includes output impedance R300 in order to produce signals with a constant voltage source 202. In this case, the output impedance R300 of the host 200 is matched to the characteristic impedance Z1 of the first differential signal line DS1. Also, by making the output impedance R300 of the host 200 variable, it is possible to match the output impedance R300 to the variable characteristic impedance Z1. In other words, it is possible to freely lay out the shape of the wiring part AR3 shown in FIG. 1.

FIG. 5 is a sectional view along the line 5-5 of the wiring part shown in FIG. 1.

A conductor (a first conductor in a broader sense) CD1 is provided in a lower layer of the wiring part AR3. In a higher layer than the conductor CD1, an insulator 12 is provided. Furthermore, the first differential signal line DS1, the second differential signal line DS2, and the signal line S1 are provided in a higher layer than the insulator 12. Parameters for determining the characteristic impedance of wirings (characteristic impedance determining parameters in a broader sense) include the width W and thickness H of the wirings, and the thickness T and dielectric constant of the insulator. In addition, the length of each wiring included in the wiring part AR3 coupling the host 200 and the target 100 is also a parameter determining the characteristic impedance of the wirings. Therefore, the characteristic impedance can be adjusted by adjusting at least one of the characteristic impedance determining parameters.

By adjusting each characteristic impedance determining parameter, it is possible to provide the first differential signal line DS1 and the second differential signal line DS2 with characteristic impedance that is easy to be matched to the input-output impedance of the host 200 or the target 100.

Figure 6:
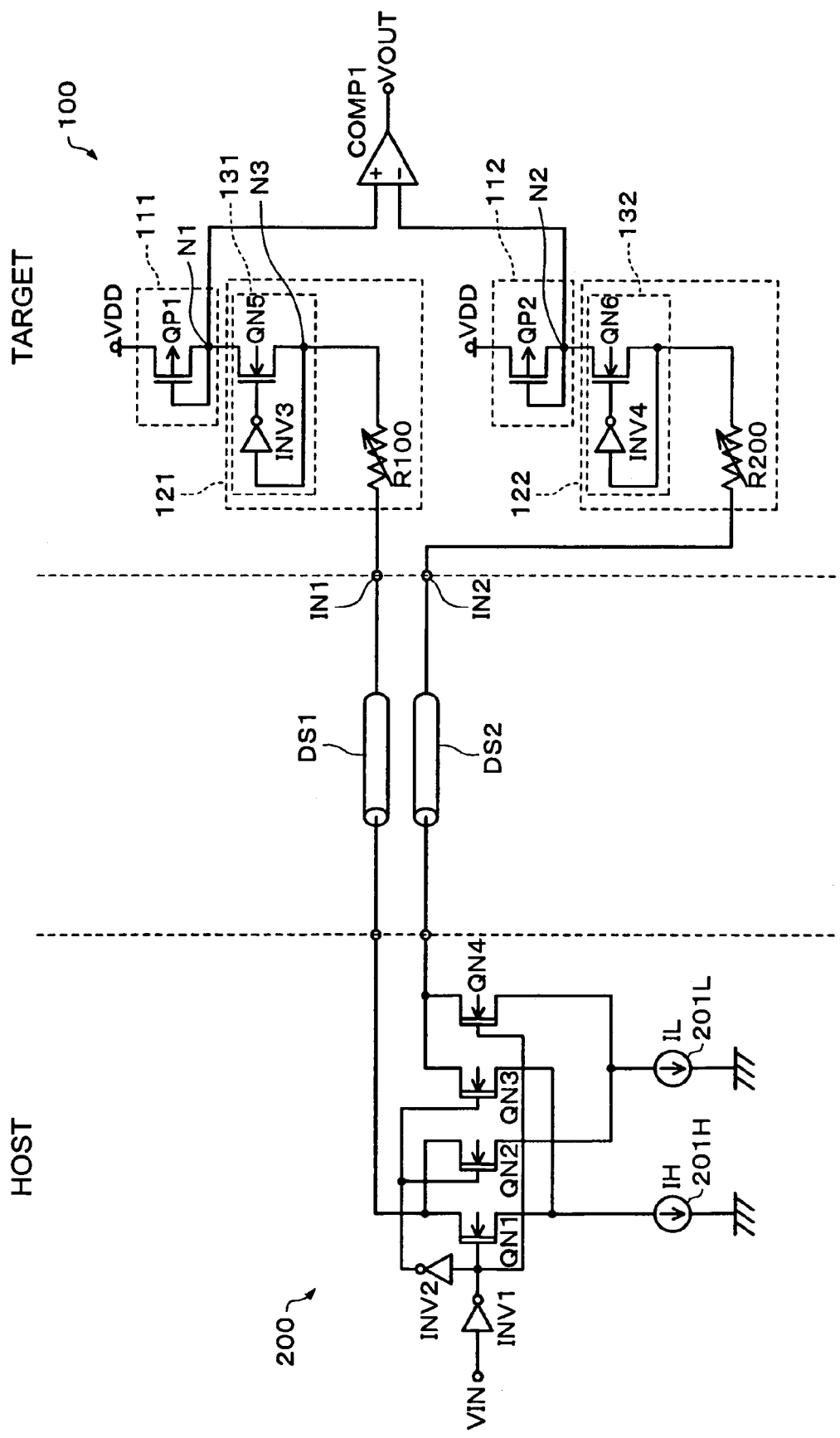
FIG. 6 is a partial view showing the circuitry of the target.

FIG. 6 is a partial view showing the circuitry of the target 100.

The host 200 includes a plurality of N-transistors QN1, QN2, QN3, and QN4; inverters INV1 and INV2; and constant current sources 201H and 201L. The target 100 includes the current-voltage converter circuitry 110 and variable input-output impedance circuitry 120. A variable input-output impedance circuit 121 includes a low impedance generator circuit 131 and a variable resistor R100.

For example, when a signal whose voltage level is high (hereinafter also referred to as a "signal H") is input to an input point VIN of the host 200, the inverter INV1 inverts the signal to have a low voltage level (hereinafter also referred to as a "signal L") and then inputs the signal L to the gate of the transistors QN1 and QN4. Accordingly, the transistors QN1 and QN4 are turned on. The inverter INV1 also inputs the signal L to the inverter INV2. The inverter INV2 inverts the signal L and outputs a signal H to the gate of the transistors QN2 and QN3. Accordingly, the transistors QN2 and QN3 are turned off.

Consequently, the first differential signal line DS1 is conductively coupled to the constant current source 201H, while the second differential signal line DS2 is conductively coupled to the constant current source 201L. This way the host 200 outputs differential signals to the first differential signal line DS1 and the second differential signal line DS2. The target 100 analyzes the differential signals transmitted by the first differential signal line DS1 and the second differential signal line DS2.

Of the target 100, the first converter circuit 111 included in the current-voltage converter circuitry 110 includes a PMOS transistor QP1, for example. If a constant current IH flows between the source and drain of the P-transistor QP1, a specific voltage VH corresponding to the constant current is generated at a node N1. In other words, if the constant current IH flows between the node N1 and the coupling point IN1, the voltage VH is generated at the node N1. This means that a current signal transmitted from the host 200 via the first differential signal line DS1 makes the constant current IH flow between the node N1 and the coupling point IN1, and the constant current IH is converted to the voltage VH.

The second converter circuit 112 included in the current-voltage converter circuitry 110 includes a PMOS transistor QP2, for example. In the same manner as the first converter circuit 111, a current signal transmitted via the second differential signal line DS2 makes a constant current IL flow between the coupling point IN2 and a node N2, and the constant current IL is converted to a voltage VL.

The comparator COMP1 compares the voltage VH converted by the first converter circuit 111 and the voltage VL converted by the second converter circuit 112. The comparator COMP1 then outputs a comparison result to an output point VOUT.

The low impedance generator circuit 131 included in the variable input-output impedance circuit 121 includes an inverter INV3 and an N-transistor QN5, for example. The inverter INV3 inverts a signal transmitted to a node N3 and outputs an inverted signal to the gate of the N-transistor QN5. The N-transistor QN5 controls a current flowing between the source and drain of the transistor QN5, in accordance with a signal input to the gate of the transistor QN5. With this structure, if a current flows between the node N1 and the node N3, impedance at the node N3 is 10 ohms to 50 ohms, for example, which is substantially smaller than the characteristic impedance Z1 of the first differential signal line DS1.

The variable input-output impedance circuit 121 matches the characteristic impedance Z1 of the first differential signal line DS1 and the input impedance of the target 100 by complementing impedance generated by the low impedance generator circuit 131 with the variable resistor R100. For example, to provide impedance matching with the characteristic impedance Z1 of the first differential signal line DS1, the variable resistor R100 is adjusted so that a total of the resistance of the variable resistor R100 and the resistance generated by the low impedance generator circuit 131 will be equal to the characteristic impedance Z1.

A variable input-output impedance circuit 122 including a low impedance generator circuit 132 and a variable resistor R200, in the same manner as the variable input-output impedance circuit 121, matches the characteristic impedance Z2 of the second differential signal line DS2 and the input impedance of the target 100. The low impedance generator circuit 132 operates in the same manner as the low impedance generator circuit 131, and includes an N-transistor QN6 and an inverter INV4.

The variable resistor R100 is not required when the impedance generated by the low impedance generator circuit 131 matches the characteristic impedance Z1 of the first differential signal line DS1. Also, the variable resistor R200 is not required when the same can be said about the low impedance generator circuit 132.

The variable resistors R100 and R200 may have impedance setting registers (not shown) in which impedance setting information for setting the impedance of the variable resistors R100 and R200 is written in the variable input-output impedance circuits 121 and 122, so that the impedance of the variable resistors R100 and R200 can be set with the impedance setting registers. By writing impedance setting information for setting the impedance of the variable resistors R100 and R200 in the impedance setting registers when designing or manufacturing the flexible substrate 10, it is easily achieve impedance matching with the characteristic impedance of wirings that are coupled to the first device DV1 and the second device DV2.

Figure 7:
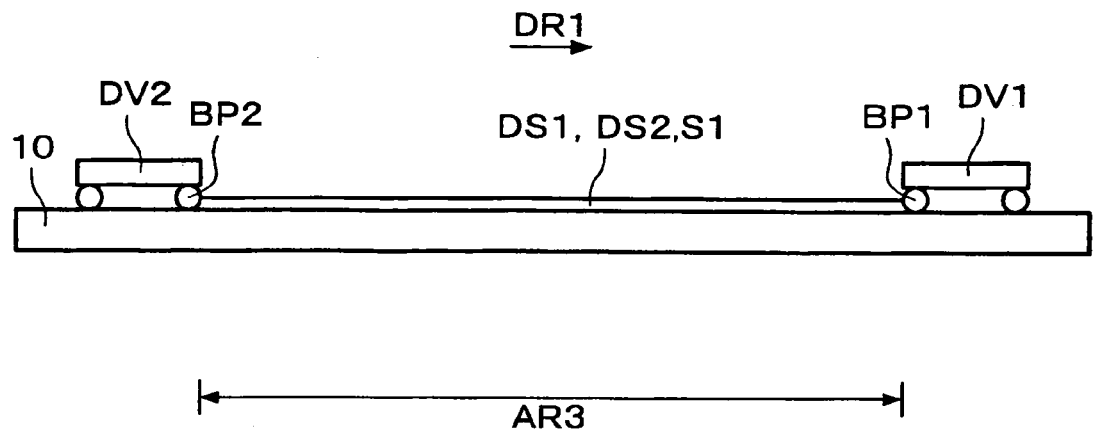
FIG. 7 is a schematic side view of the flexible substrate shown in FIG. 1.

FIG. 7 is a schematic side view of the flexible substrate 10 shown in FIG. 1 when seen from the direction DR3 in FIG. 1.

The first terminal P1, the second terminal P2, the conductor CD1, and the like are not shown in this drawing for simplifying the description. According to the present embodiment, the first device DV1 and the second device DV2 are mounted on the flexible substrate 10 as bare chips. Therefore, on the flexible substrate 10 of the present embodiment, a plurality of wirings provided with the wiring part AR3 is directly coupled to a bump BP1 of the first device DV1, a bump BP2 of the second device DV2, and the like, with no other coupling parts such as a connector therebetween. For example, the bump BP1 of the first device DV1 is coupled to the first differential signal line DS1, and the bump BP2 of the second device DV2 is also coupled to the first differential signal line DS1. The impedance of the first device DV1 and the second device DV2 is matched to the impedance of the first differential signal line DS1 and the second differential signal line DS2. However, small signal reflection actually occurs at a coupling point between wirings even if impedance matching has been provided for these wirings.

According to the present embodiment, the first device DV1 and the second device DV2 are coupled to the first differential signal line DS1 and the second differential signal line DS2 at the two points: the bumps BP1 and BP2. This structure is intended to minimize areas in which the small signal reflection could occur. Therefore, it is possible to prevent signal degradation while transmitting high-frequency signals, and thus to transfer serial data at high speed, for example.

Figure 8:
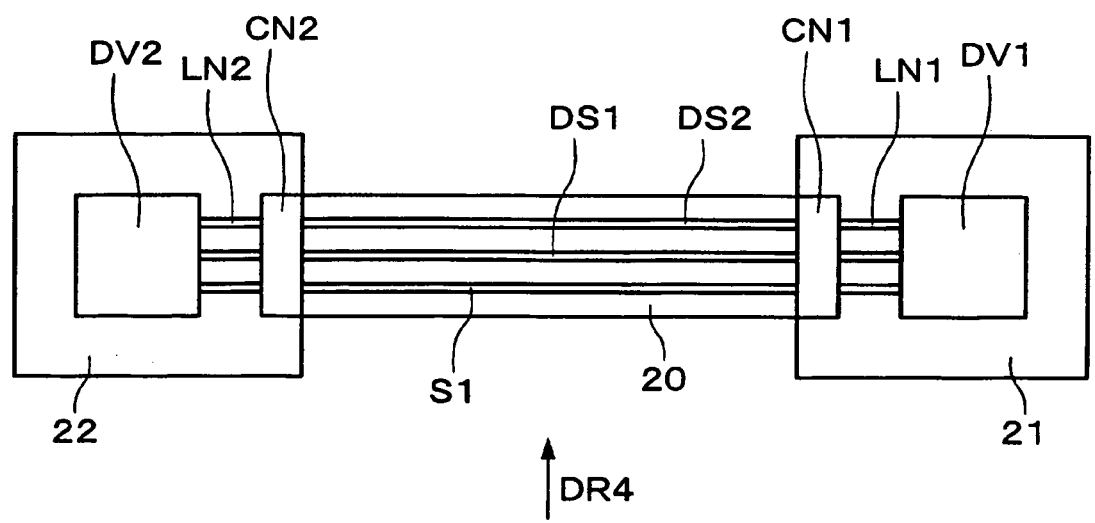
FIG. 8 shows the structure of a comparative example according to the present embodiment.
Figure 9:
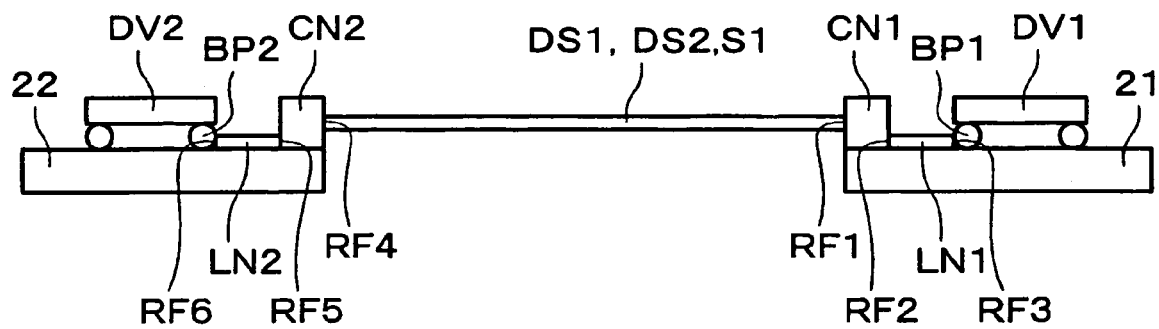
FIG. 9 is a schematic side view showing the substrates and the flexible substrate shown in FIG. 8.

Referring now to FIGS. 8 and 9, the present embodiment and a comparative example are compared in terms of where signal reflection occurs. FIG. 8 shows the structure of the comparative example.

A substrate 21 is provided with the first device DV1, while a substrate 22 is provided with the second device DV2. The substrates 21 and 22 are coupled to each other via a plurality of wirings (i.e. the first differential signal line DS1, the second differential signal line DS2, the signal line S1) provided on a substrate 20 via connectors CN1 and CN2. The first device DV1 and the second device DV2 are coupled to the connectors CN1 and CN2 via wirings LN1 and LN2.

FIG. 9 is a schematic side view showing the substrates 21 and 22 and the flexible substrate 20 shown in FIG. 8 when seen from the direction DR4.

A reflection point RF1 is a point at which the first differential signal line DS1 is coupled to the connector CN1, for example. A reflection point RF2 is a point at which the connector CN1 is coupled to the wiring LN1, for example. A reflection point RF3 is a point at which the wiring LN1 is coupled to the bump BP1 of the first device DV1. The same can be said about a portion on the side of the second device DV2: a reflection point RF4 is a point at which the differential signal line DS2 is coupled to the connector CN2; a reflection point RF5 is a point at which the connector CN2 is coupled to the wiring LN2; and a reflection point RF6 is a point at which the wiring LN2 is coupled to the bump BP2.

A signal transmitted between the first device DV1 and the second device DV2 goes through the six reflection points RF1 to RF6. If the first device DV1 and the second device DV2 are mounted in other way than bare chip mounting, the number of such reflection points increases. For example, signal reflection occurs at a reflection point RF7 coupling a substrate 23 (an interposer, for example) and a wire WR of an IC chip, as shown in FIG. 10.

Figure 10:
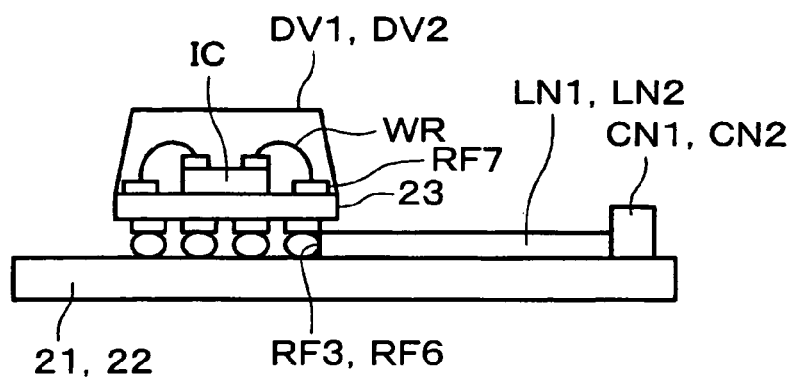
FIG. 10 shows the structure of the comparative example according to the present embodiment.

With the structure shown in FIGS. 9 and 10, it is difficult to transfer serial data at high speed in consideration of signal degradation etc. Since the flexible substrate 10 of the present embodiment shown in FIG. 7 has only two reflection points, it can transmit signals with less signal degradation than the flexible substrate 20 shown in FIG. 8. In addition, it is necessary to provide impedance matching in the design stage in order to minimize signal reflection at each reflection point. Since the structure of the comparative example shown in FIG. 8 has many reflection points, there is a problem in that manufacturing cost increases to provide impedance matching. The flexible substrate 10 of the present embodiment, however, has fewer reflection points and is equipped with the variable input-output impedance circuits 121 and 122. Therefore, it is easy to achieve impedance matching and reduce manufacturing cost.

2. Host and Target

Figure 11:
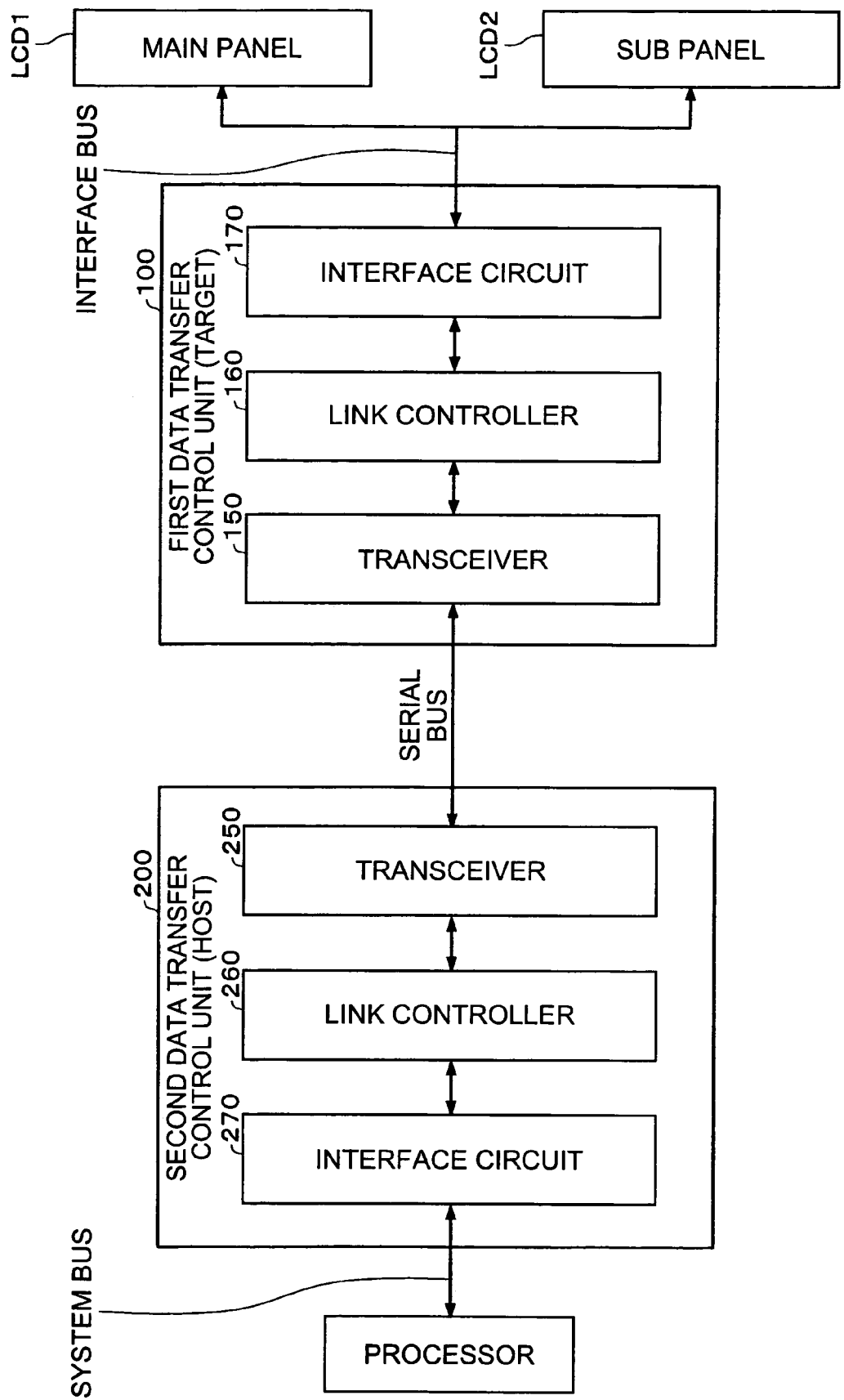
FIG. 11 is a block diagram showing data transfer processing by the first data transfer control unit and the second data transfer control unit according to the present embodiment.

Referring now to FIG. 11, data transfer processing by the first data transfer control unit 100 and the second data transfer control unit 200 according to the present embodiment will be briefly described.

The first data transfer control unit (target) 100 includes a transceiver 150, a link controller 160, and an interface circuit 170. The transceiver 150 executes processing of the physical layer, while the link controller 160 executes processing of the link layer. The interface circuit 170 may be coupled to a display (e.g. a main panel LCD1 or sub panel LCD2) and the like via an interface bus. In the same manner, the second data transfer control unit (host) 200 includes a transceiver 250, a link controller 260, and an interface circuit 270. The interface circuit 270 may be coupled to a processor and the like via a system bus, for example. The target 100 and the host 200 transfer serial data via a serial bus at high speed. In the present embodiment, the serial bus includes a differential signal line pair (i.e. the first differential signal line DS1 and the second differential signal line DS2).

The host 200 provides the target 100 with a clock. The target 100 uses the provided clock as the system clock of the target 100. The interface circuit 270 outputs signals from the processor etc. to the link controller 260. The link controller 260 creates a request packet (a write request packet, a read request packet) based on the output from the interface circuit 270, and directs the transceiver 250 to transmit the created request packet. Accordingly, a transmission transaction is initiated. Thus the transceiver 250 executes processing for transmitting the request packet to the target 100 via the serial bus. Note that the transceiver 250 can execute processing for receiving a request packet from the first data transfer control unit 100. In this case, the link controller 260 analyzes the received request packet and executes processing of the link layer (transaction layer).

The transceiver 150 of the target 100 executes processing for receiving the request packet transmitted from the host 200 via a serial bus. The link controller 160 analyzes the received request packet and executes processing of the link layer (transaction layer). Note that the transceiver 150 can execute processing for transmitting a request packet to the second data transfer control unit 200. In this case, the link controller 160 creates a request packet to be transmitted and directs the transceiver 150 to transmit the created request packet.

The interface circuits 170 and 270 enable data to be transferred via a bus (parallel bus) that is different from the serial bus. For example, if the main panel LCD1 is equipped with an RGB interface (a stream interface in a broader sense) and the sub panel LCD2 is equipped with an MPU interface (a command/data interface in a broader sense), the interface circuit 170 makes it possible to transfer data to the panels coupled to a common interface bus. In other words, it is possible for the processor to send display data to the system bus irrespective of an interface difference between the main panel LCD1 and the sub panel LCD2 in order to transfer the data to the main panel LCD1 or the sub panel LCD2. This way highly generic interfaces can be provided.

The structure of the first data transfer control unit 100 and the second data transfer control unit 200 is not limited to what FIG. 11 shows. For example, the first data transfer control unit 100 and the second data transfer control unit 200 may include not the interface circuits 170 and 270 but other circuit blocks.

Figure 12:
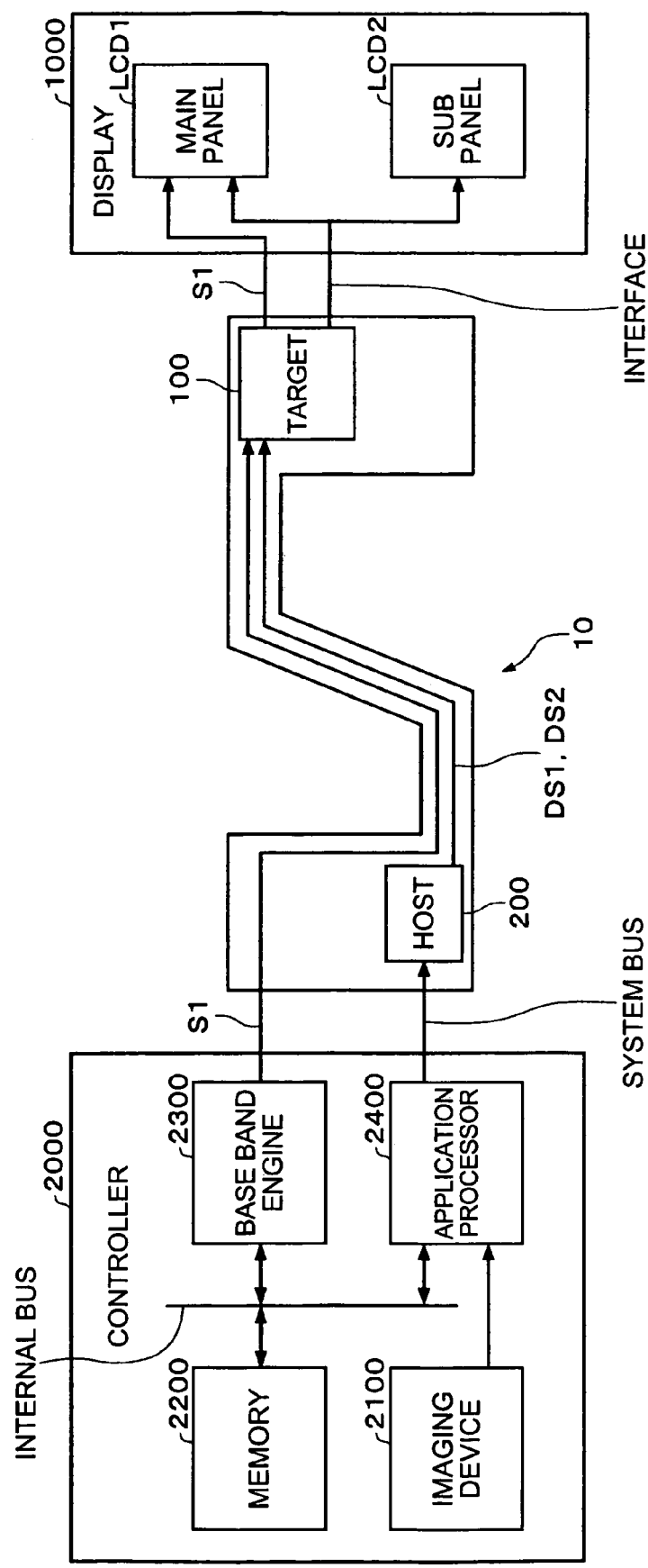
FIG. 12 is a block diagram showing a system example including the flexible substrate of the present embodiment.

FIG. 12 is a block diagram showing a system example including the flexible substrate 10 of the present embodiment.

A display 1000 (a first substrate in a broader sense) includes, for example, the main panel LCD1 and the sub panel LCD2. A controller 2000 (a second substrate in a broader sense) includes, for example, an imaging device (e.g. a CCD, a CMOS sensor) 2100, a memory 2200, a base band engine 2300, and an application processor 2400. The imaging device (e.g. a CCD, a CMOS sensor) 2100, the memory 2200, the base band engine 2300, and the application processor 2400 are coupled to each other via an internal bus. The system shown in FIG. 12 is not intended to limit the structure of the present invention. For example, the controller 2000 may not include the base band engine 2300 and the imaging device 2100. Furthermore, the display 1000 may do without either the main panel LCD1 or the sub panel LCD2.

The target 100 brings signals transmitted via the signal line S1 through so as to send the signals transmitted via the signal line S1 to the main panel LCD1, for example. In other words, using the flexible substrate 10 of the present embodiment makes it possible to transfer serial data at moderate speed and transfer serial data by means of differential signals at high speed simultaneously. For example, it is possible to transfer data whose data size is small created by the base band engine 2300 etc., via the signal line S1 if the data can be transferred at moderate speed. Also, it is possible to transfer data whose data size is large created by the application processor 2400 etc., via the first the first differential signal line DS1 and the second differential signal line DS2 at high speed.

3. Wiring Part Modifications

Figure 13:
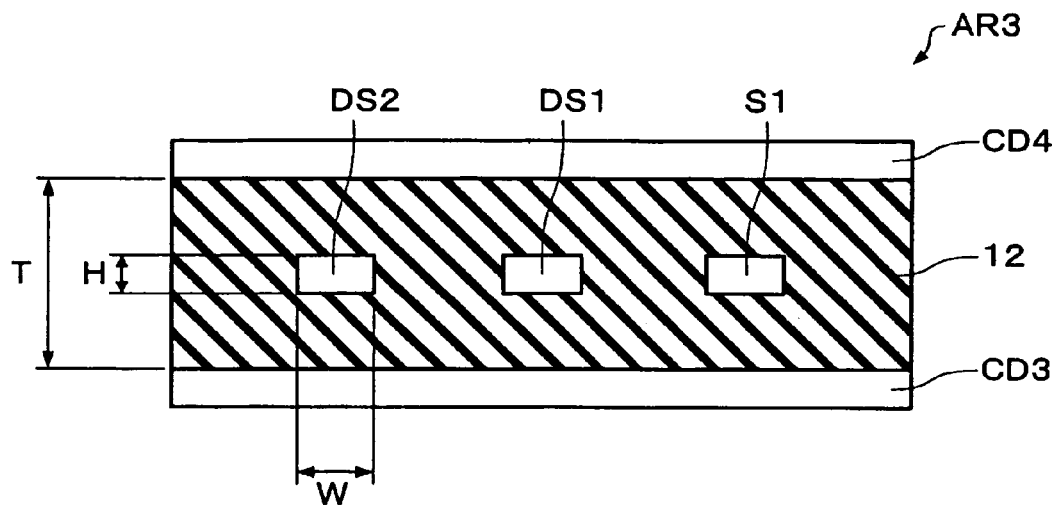
FIG. 13 shows a cross-section surface of a modification according to the present embodiment.

According to the present embodiment, a plurality of wirings included in the wiring part AR3 of the flexible substrate 10 are made up of microstrip lines as shown in FIG. 5, for example. In a modification of the present embodiment, the structure may have such a cross-section surface as the one shown in FIG. 13 (e.g. strip-type structure or strip lines). A conductor (a third conductor in a broader sense) CD3 is provided in a lower layer of the wiring part AR3 of this modification, and extends in the direction DR1 or DR2 shown in FIG. 1. The insulator 12 is provided with a plurality of wirings (e.g. the first differential signal line DS1, the second differential signal line DS2, the signal line S1). In a higher layer than the insulator 12, a conductor (a fourth conductor in a broader sense) CD4 is provided. Also with this structure, it is possible to set characteristic impedance by adjusting the width W and thickness H of the wirings, and the thickness T of the insulator 12, which are characteristic impedance determining parameters.

Figure 14:
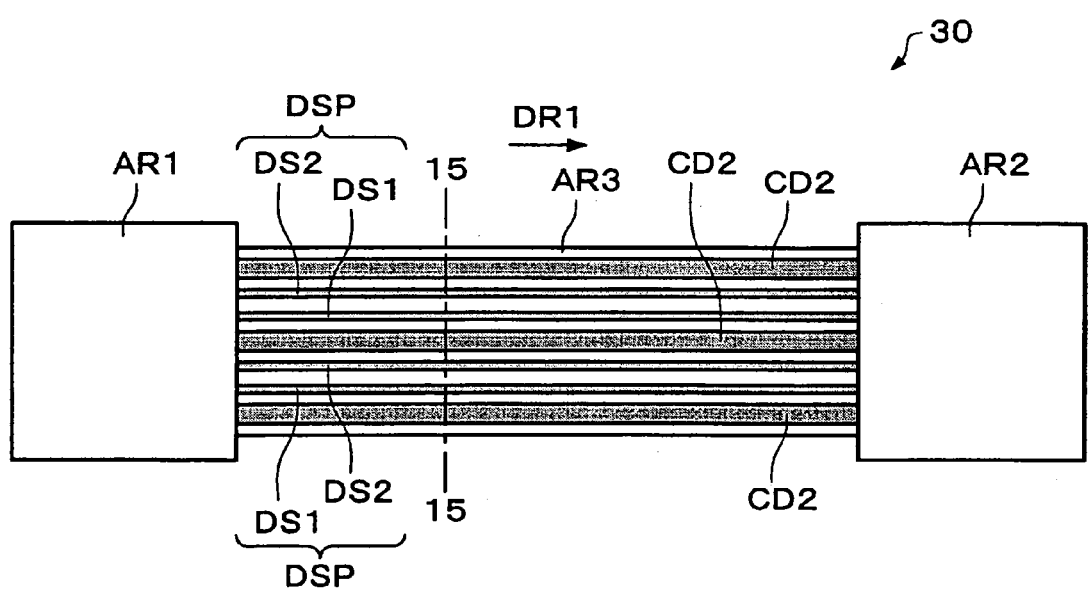
FIG. 14 is a schematic view showing a flexible substrate of another modification of the present embodiment.

FIG. 14 is a schematic view showing a flexible substrate 30 of another modification of the present embodiment.

In the wiring part AR3 coupling the first part AR1 and the second part AR2, the differential signal line pair DSP provided in a plural number and the conductor CD2 (the second conductor in a broader sense) provided in a plural number extend in the direction DR1. The differential signal line pair DSP includes the first differential signal line DS1 and the second differential signal line DS2. While other wirings (the signal line S1, for example) than the differential signal line pair DSP are not shown in FIG. 14 for simplifying the description, it is not intended to limit the structure. In the wiring part AR3, one (not plural) differential signal line pair DSP and one (not plural) conductor CD2 may extend in the direction DR1. Here, the plurality of wirings included in the wiring part AR3 shown in FIG. 14 are made up of microstrip lines, for example. The signal line S1 not shown may not be made up of microstrip lines, and only the differential signal line pair DSP may be made up of microstrip lines.

Figure 15:
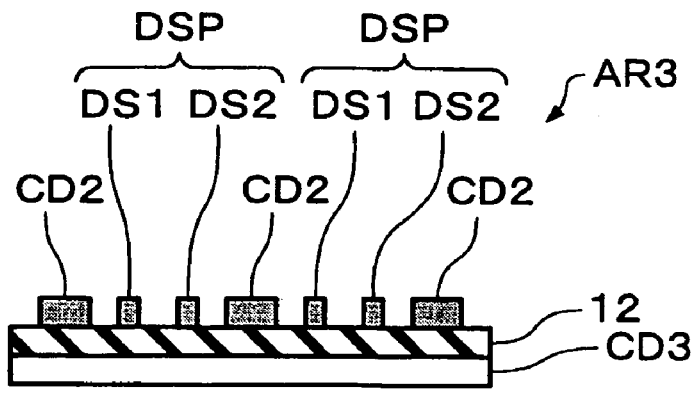
FIG. 15 is a sectional view of the structure shown in FIG. 14.

FIG. 15 is a sectional view along the line 15-15 shown in FIG. 14. The conductor (the third conductor) CD3 is provided in a lower layer of the wiring part AR3. The conductor CD3 extends in the direction DR1 shown in FIG. 14. Since the conductor CD2 is provided between one differential signal line pair DSP and the neighboring differential signal line pair DSP, the conductor CD2 acts as a shield and makes it possible for the flexible substrate 30 of this modification to transfer data more efficiently with little signal degradation.

Figure 16:
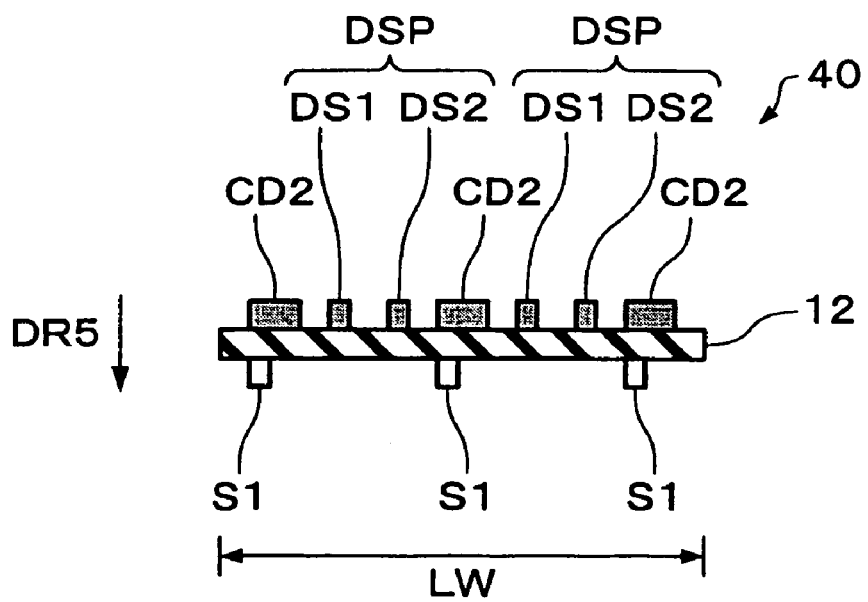
FIG. 16 is a sectional view showing a flexible substrate that is a modification of the flexible substrate shown in FIG. 14.

FIG. 16 is a sectional view of a flexible substrate 40, a modification of the flexible substrate 30 shown in FIG. 14.

A plurality of wirings included in the wiring part AR3 of the flexible substrate 40 are made up of coplanar lines, for example. The upper surface of the flexible substrate 40 is just the same as the one shown FIG. 14. What differs from the flexible substrate 30 here is the sectional structure of the wiring part AR3. Referring to FIG. 16, the signal line S1 is provided in a lower layer of the wiring part AR3 of the flexible substrate 40, and the insulator 12 is provided in a higher layer. Provided on top of the insulator 12 are the differential signal line pair DSP and the conductor CD2. The differential signal line pair DSP, the signal line S1, and the conductor CD2 extend in the direction DR1 shown in FIG. 14.

The conductor CD2 acts as a shield in the same manner as the structure shown in FIG. 15. Due to the effect of the shield, the flexible substrate 40 can transfer data with little signal degradation. The shield effect also allows the signal line S1 to be provided below the conductor CD2 in FIG. 16 (e.g. in a position opposing the conductor CD2 in the direction DR5 in FIG. 16). Therefore, it is possible to prevent interference between the signal line S1 and the differential signal line pair DSP. As a result, the flexible substrate 40 of the modification not only prevents signal degradation, but also reduces wiring width LW of the wiring part AR3 of the flexible substrate 40. Furthermore, since this structure requires no complicated manufacturing process, it is highly cost effective. In other words, the flexible substrate 40 that is highly generic can be provided economically, while increasing the versatility of the layout of the wiring part AR3.

While the differential signal line pair DSP and the signal line S1 are provided in a plural number in FIG. 16, it is not intended to limit the structure. In the wiring part AR3, one (not plural) differential signal line pair DSP and one (not plural) signal line S1 may be provided. Moreover, each signal line S1 is provided directly below the conductor CD2 in the drawing, it is not intended to limit the structure. The signal line S1 may be provided directly below the differential signal line pair DSP instead.

4. Flexible Substrate Couplings

Figure 17:
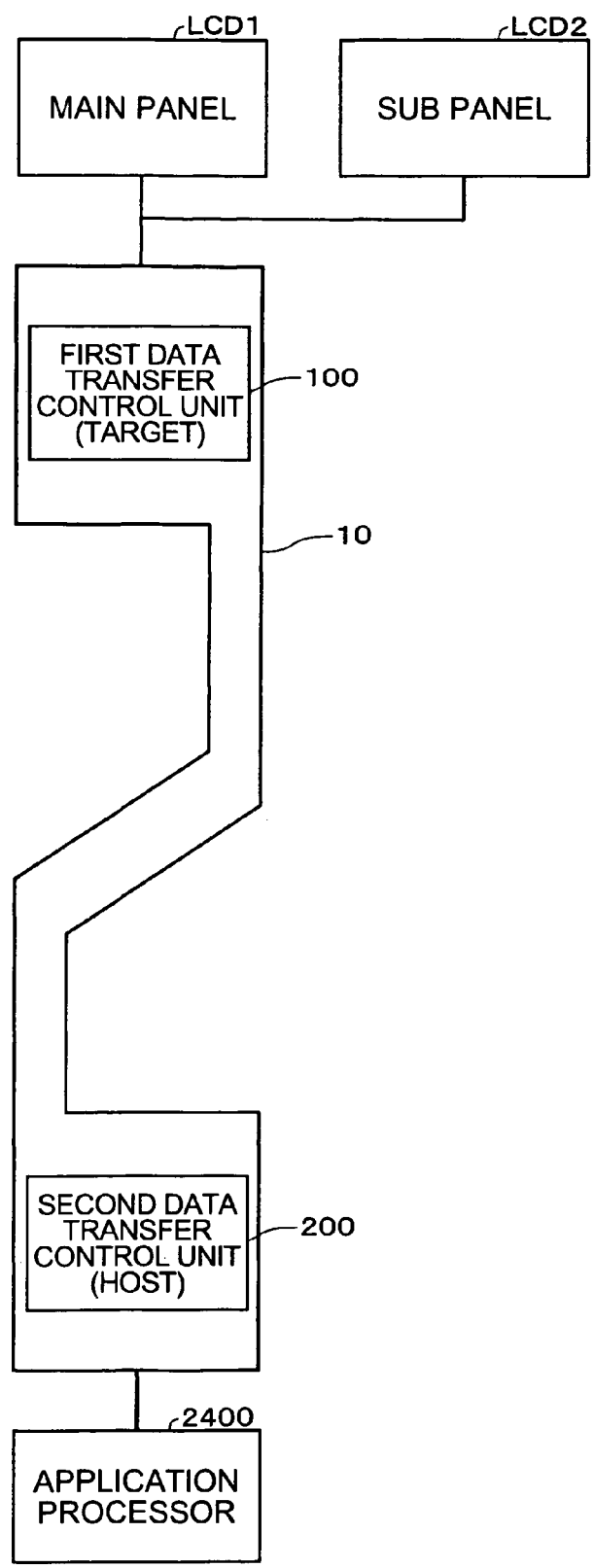
FIG. 17 is a view of the flexible substrate shown in FIG. 1 that is used for coupling the application processor, the main panel and the sub panel.

FIG. 17 is a view of the flexible substrate 10 shown in FIG. 1 that is used for coupling the application processor 2400, the main panel LCD1 and the sub panel LCD2.

The application processor 2400 may transmit display data and the like to the main panel LCD1 or the sub panel LCD2 via the flexible substrate 10. If there is no need to use differential signals when the application processor 2400 receives information from the main panel LCD1 or the sub panel LCD2, the second data transfer control unit 200 (host) may do without a function for receiving differential signals. In the same manner, the first data transfer control unit 100 (target) may do without a function for sending differential signals. By omitting the functions of the first data transfer control unit 100 and the second data transfer control unit 200, it is possible to reduce cost for manufacturing the first data transfer control unit 100 and the second data transfer control unit 200. Accordingly, the flexible substrate 10 can be provided economically.

Figure 18:
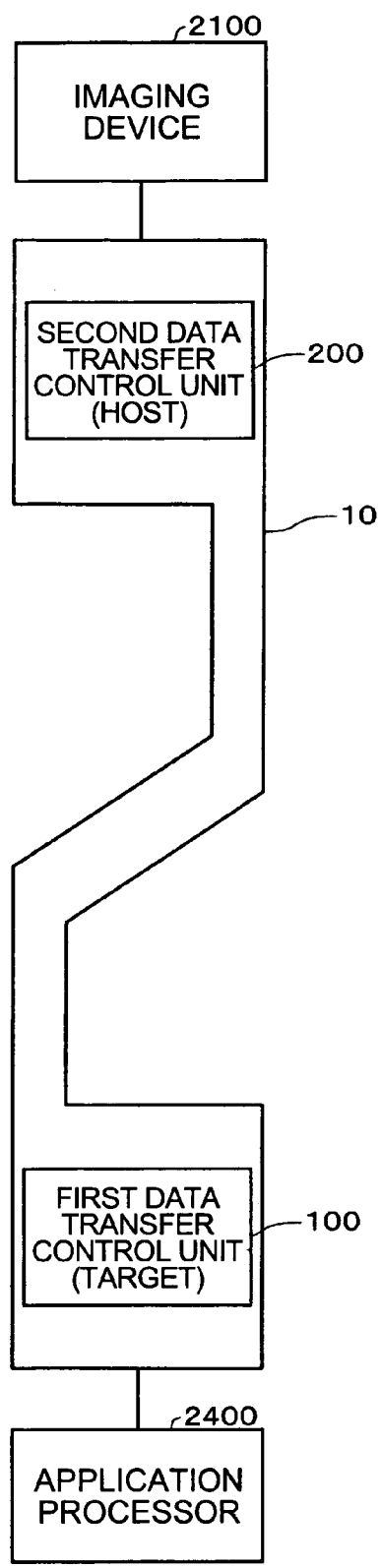
FIG. 18 is a view of the flexible substrate shown in FIG. 1 that is used for coupling the application processor and the imaging device.

FIG. 18 is a view of the flexible substrate 10 shown in FIG. 1 that is used for coupling the application processor 2400 and the imaging device 2100.

Imaging data etc. captured by the imaging device 2100 is transmitted to the application processor 2400 via the flexible substrate 10. If there is no need to use differential signals for sending data from the application processor 2400 to the imaging device 2100 via the flexible substrate 10, the first data transfer control unit 100 may do without a function for sending differential signals. In the same manner, the second data transfer control unit 200 may do without a function for receiving differential signals. Here again, it is possible to reduce cost for manufacturing the first data transfer control unit 100 and the second data transfer control unit 200. Accordingly, the flexible substrate 10 can be provided economically.

Figure 19:
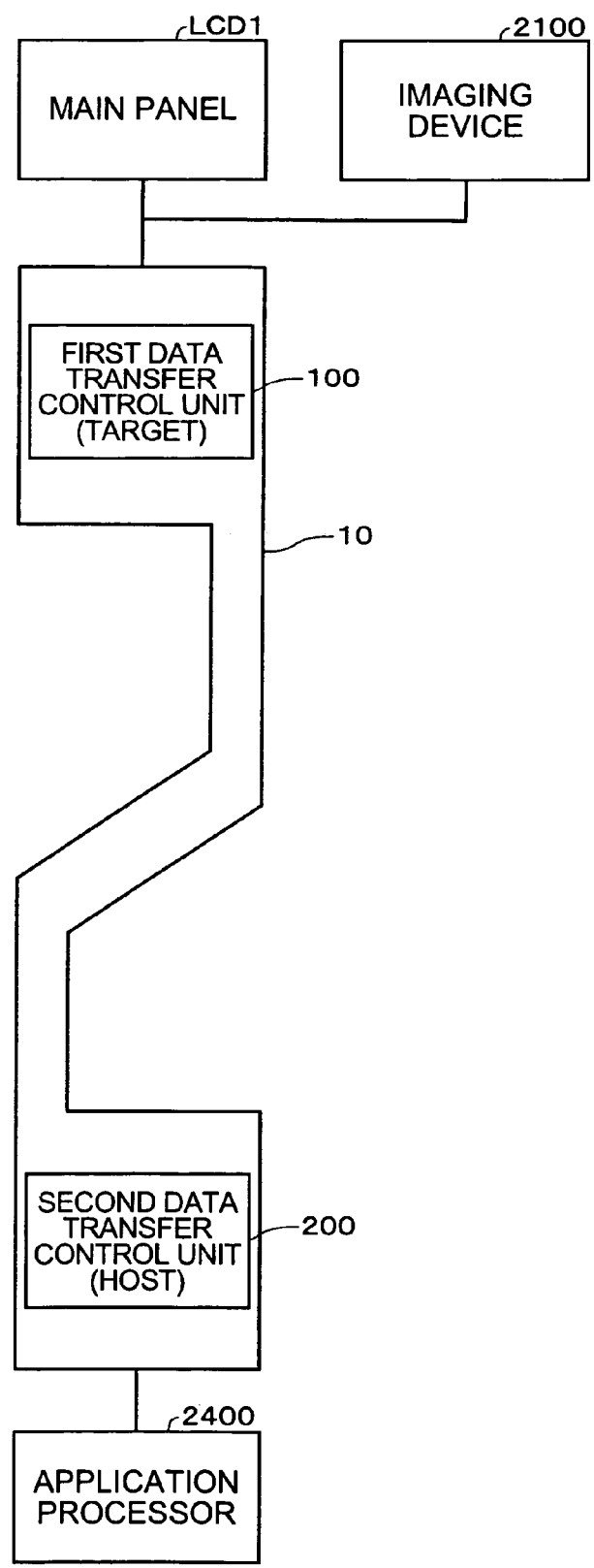
FIG. 19 is a view of the flexible substrate shown in FIG. 1 that is used for coupling the main panel and the imaging device, and the application processor.

FIG. 19 is a view of the flexible substrate 10 shown in FIG. 1 that is used for coupling the main panel LCD1 and the imaging device 2100, and the application processor 2400.

Since the first data transfer control unit 100 and the second data transfer control unit 200 have functions for sending and receiving differential signals, it is possible to bi-directionally communicate data between the application processor 2400, and the main panel LCD1 and the imaging device 2100. Data from the application processor 2400 is transmitted to the main panel LCD1 via the differential signal line pair included in the flexible substrate 10. Imaging data etc. of the imaging device 2100 is transmitted to the application processor 2400 via the differential signal line pair included in the flexible substrate 10. It is possible to transfer imaging data etc. of the imaging device 2100 at high speed with differential signals. Accordingly, there is no need to provide the imaging device 2100 near the application processor 2400, which increases layout versatility.

While the flexible substrate 10 is shown as an example in FIGS. 17 to 19, the same coupling conditions can be applied to modifications of the flexible substrate 10 (e.g. the flexible substrates 30 and 40). Also, while the application processor 2400 is given as a device example that is coupled to the flexible substrate 10, it is not intended to limit the structure. With the structure of the flexible substrate 10 and its modifications, it is possible to couple the base band engine 2300 and the application processor 2400, for example.

Figure 20:
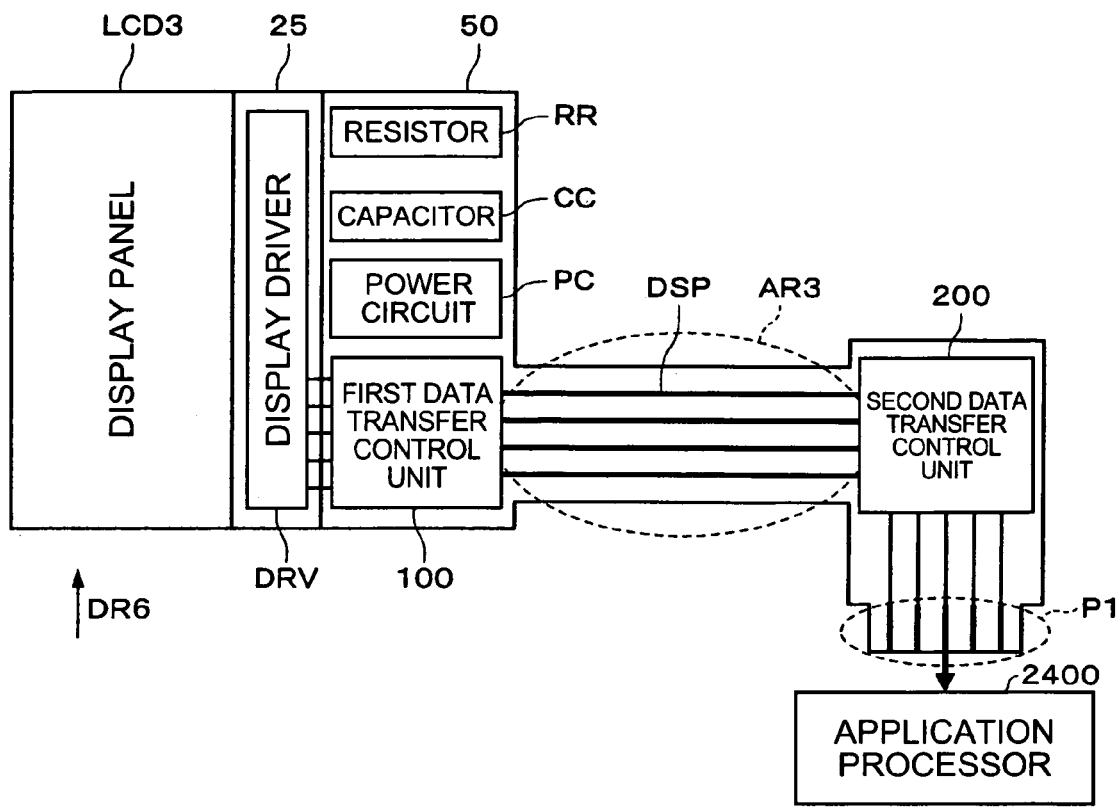
FIG. 20 a schematic view showing a flexible substrate of another modification.

FIG. 20 is a schematic view showing a flexible substrate 50 of another modification of the flexible substrate 10.

What differs from the flexible substrate 10 here is that the flexible substrate 50 is provided with a power circuit PC, a capacitor CC, and a resistor RR on the side of the first data transfer control unit 100. Note that the flexible substrate 50 may do without the power circuit PC, the capacitor CC, or the resistor RR. The structure of the wiring part AR3 of the flexible substrate 50 may be the same as the structure of the wiring part AR3 of the flexible substrates 30 and 40.

A display panel LCD3 and a display driver DRV are provided with a substrate (e.g. a glass substrate) 25.

Figure 21:
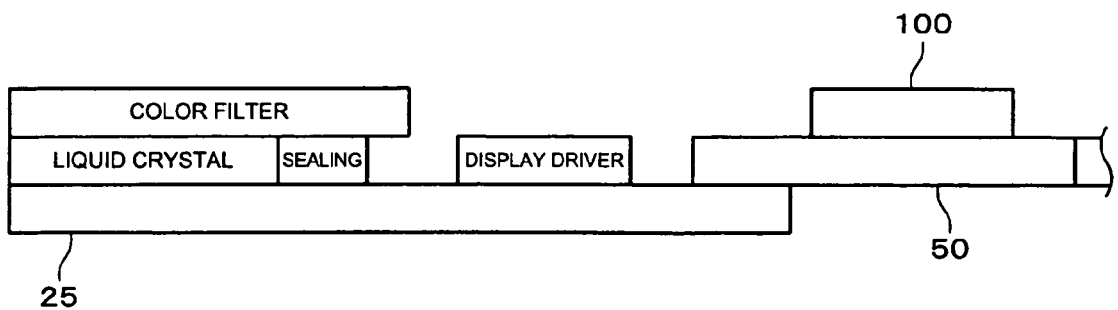
FIG. 21 is a partial side view showing the substrate and the flexible substrate on which the first data transfer control unit is provided.

FIG. 21 is a partial side view of the substrate 25 and the flexible substrate 50 when seen from the direction DR6, which is on the side of the first data transfer control unit 100.

While the flexible substrate 50 is directly coupled to the substrate 25 referring to FIG. 21, it can be coupled via a coupling part such as a connector. By using the flexible substrate 50, there is no need to separately provide a power circuit for the display panel LCD3 and the display driver DRV, and thereby easily manufacturing a display system using the application processor 2400 etc. and the substrate 25 fitted with the display panel LCD3. Therefore, it is possible to reduce time required for designing and thus cut manufacturing cost.

Figure 22:
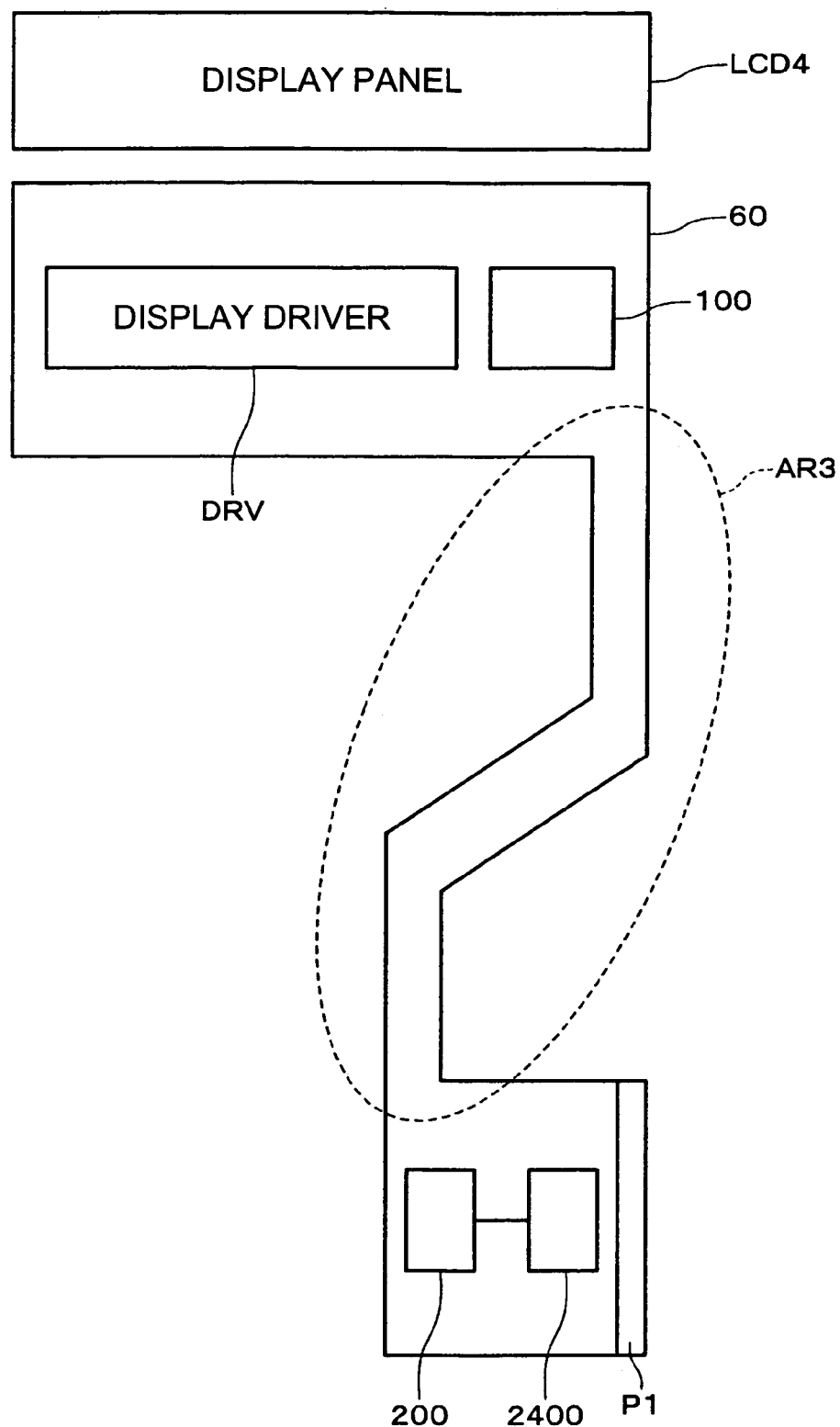
FIG. 22 a schematic view showing a flexible substrate of another modification.

FIG. 22 is a schematic view showing a flexible substrate 60 of another modification of the flexible substrate 10.

What differs from the flexible substrate 10 here is that the flexible substrate 60 is provided with the display driver DRV on the side of the first data transfer control unit 100, and the application processor 2400 on the side of the second data transfer control unit 200. The flexible substrate 60 may be coupled via a coupling part such as a connector, or directly to a display panel LCD4. With this structure, the flexible substrate 60 can be coupled to the display panel LCD4 having no display driver DRV. Also, since the flexible substrate 60 is provided with the application processor 2400, it is possible to easily manufacture a display system using the display panel LCD4 and the flexible substrate 60.

In the same manner as the above-mentioned structure, the flexible substrate 60 may be provided with the power circuit PC, the capacitor CC, the resistor RR, etc., on the side of the display driver DRV. As mentioned earlier, by providing other devices (e.g. the application processor 2400, the display driver DRV, the power circuit PC, the capacitor CC, the resistor RR) near the first data transfer control unit 100 and the second data transfer control unit 200 included in the flexible substrate 60, it is possible to reduce time required for designing the system using the flexible substrate 60, such as a display system. Accordingly, manufacturing cost can be reduced as well. Note that the structure of the wiring part AR3 of the flexible substrate 60 may be the same as that of the flexible substrates 30 and 40. Furthermore, the flexible substrate 60 may do without the application processor 2400.

Also, a processor such as the application processor 2400 may be added to the flexible substrates 10, 30, 40, and 50.

Note that a plurality of wirings are not shown in FIGS. 17, 18, 19, and 22 for simplifying the description.

5. Electronic Equipment

The flexible substrate 10 of the present embodiment is applicable to various kinds of electronic equipment.

Figure 23:
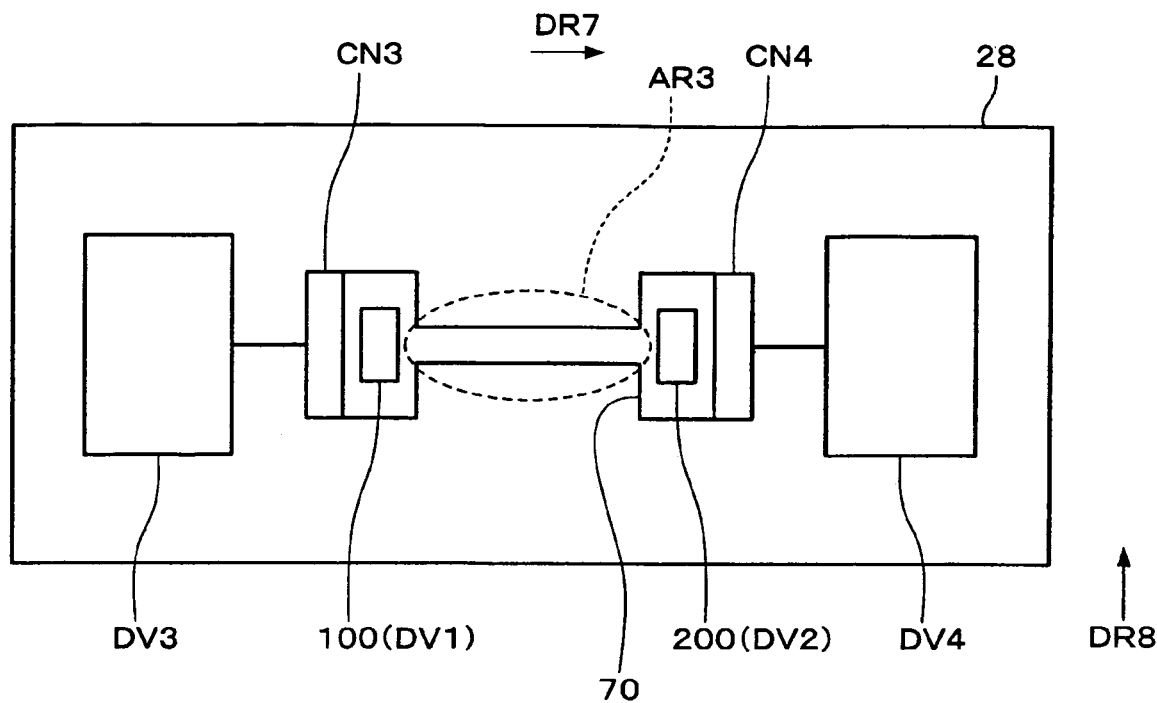
FIG. 23 a schematic view showing a substrate coupled to a flexible substrate.

FIG. 23 is a schematic view showing a substrate 28 coupled to a flexible substrate 70.

In the flexible substrate 70, the wiring part AR3 of the flexible substrate 10 shown in FIG. 1 extends in the direction DR7 without being bent. Note that a plurality of wirings are not shown in FIG. 23 for simplifying the description. A device DV3 is coupled to a connector CN3, while a device DV4 is coupled to a connector CN4. The flexible substrate 70 is coupled to the connectors CN3 and CN4. In other words, the device DV3 and the device DV4 are coupled to each other with the flexible substrate 70 therebetween. Through the wiring part AR3 of the flexible substrate 70, the first data transfer control unit 100 and the second data transfer control unit 200 transmit high-frequency signals.

Figure 24:
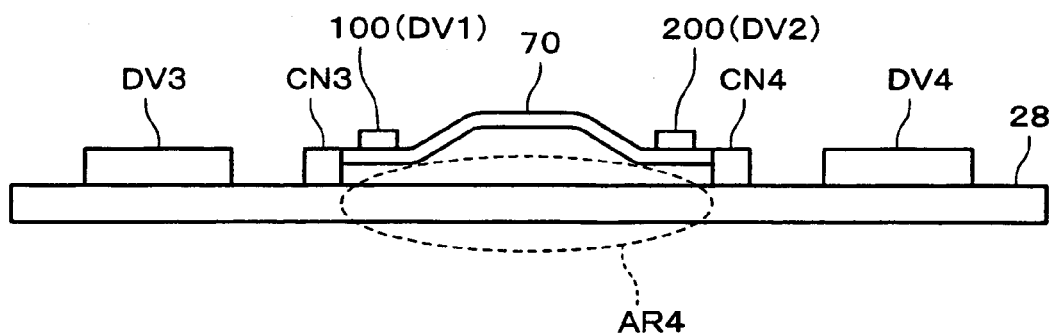
FIG. 24 is a schematic side view of the substrate shown in FIG. 23.

FIG. 24 is a schematic side view of the flexible substrate 28 shown in FIG. 23 when seen from the direction DR8.

Referring to FIG. 24, an empty space is formed between the flexible substrate 70 and the substrate 28. This space can reduce the effect of high-frequency signals transmitted through the wiring part AR3 of the flexible substrate 70 on a part AR4 of the substrate 28. Therefore, it is possible to provide other wirings and circuits on the part AR4 of the substrate 28.

Generally speaking, it is difficult to build the multilayered structure of substrates transmitting high-frequency signals, since transmitting high-frequency signals in multilayered substrates can affect peripheral wirings and circuits. Using the flexible substrate 70 as shown in FIG. 23, however, makes it possible to build the multilayered structure of the substrate 28. Accordingly, it is possible to reduce cost for manufacturing electronic equipment including the substrate 28 provided with the flexible substrate 70. Also, since it is possible to build the multilayered structure of the substrate 28, electronic equipment including the substrate 28 can be designed small. Furthermore, since it is possible to include a circuit etc. in the part AR4 of the substrate 28, the area of the substrate 28 can be used efficiently.

Figure 25:
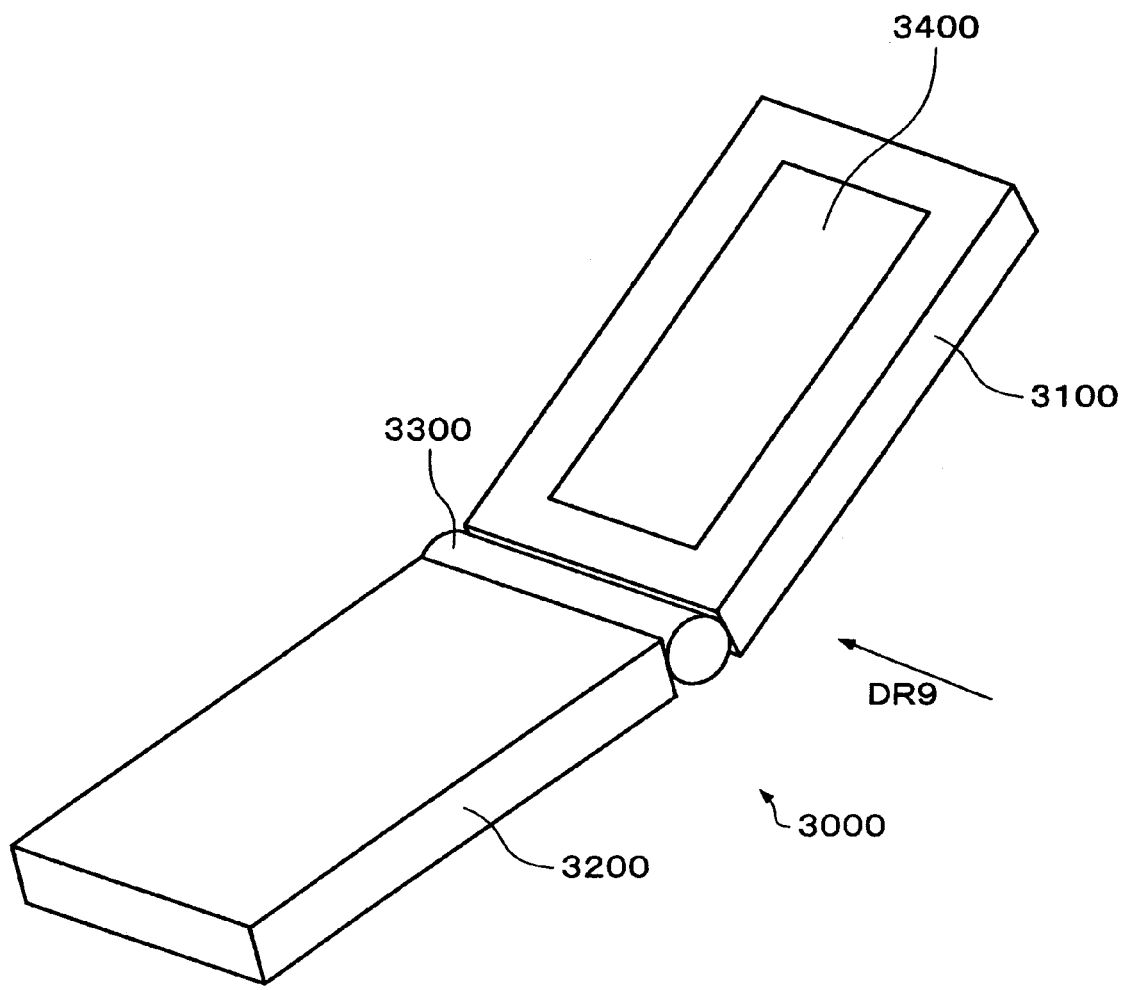
FIG. 25 is a schematic perspective view showing the appearance of small-sized electronic equipment equipped with a display panel.

FIG. 25 is a schematic perspective view showing the appearance of small-sized electronic equipment equipped with a display panel.

Electronic equipment 3000 includes a first equipment part 3100, a second equipment part 3200, and a coupling part 3300 that couples the first equipment part 3100 and the second equipment part 3200. The first equipment part 3100 includes a display panel 3400. Although the electronic equipment 3000 also includes a controller provided with operation buttons etc., the controller is not shown in FIG. 25 for simplifying the description. Examples that have the structure of the electronic equipment 3000 may include portable electronic equipment (e.g. handheld gaming devices, personal portable information devices (PDAs: personal digital assistants or personal data assistants), electronic notebooks, portable computers, notebook computers) and portable radio terminals (e.g. mobile telephones, personal handyphone systems, PDAs with built-in radios, small-sized computers with built-in radios). Although not shown in the drawing, the first equipment part 3100 is provided with a first substrate and the second equipment part 3200 is provided with a second substrate.

For example, when signals are transmitted between the first substrate of the first equipment part 3100 and the second substrate of the second equipment part 3200 in equipment having the structure of the electronic equipment 3000, a channel for transmitting such signals goes through the coupling part 3300. Depending on the shape of the coupling part 3300, there are cases where no room large enough for accommodating the transmitting channel in the coupling part 3300 can be made, particularly when the coupling part 3300 is composed of moving parts. This issue becomes more critical when the amount of information transmitted between the first equipment part 3100 and the second equipment part 3200 increases. The flexible substrate 10 etc. of the present embodiment, however, makes it possible to freely design the shape of the wiring part AR3. Accordingly, the flexible substrate 10 can be easily built in the electronic equipment 3000. The flexible substrate 10 built in the electronic equipment 3000 will now be described.

Figure 26:
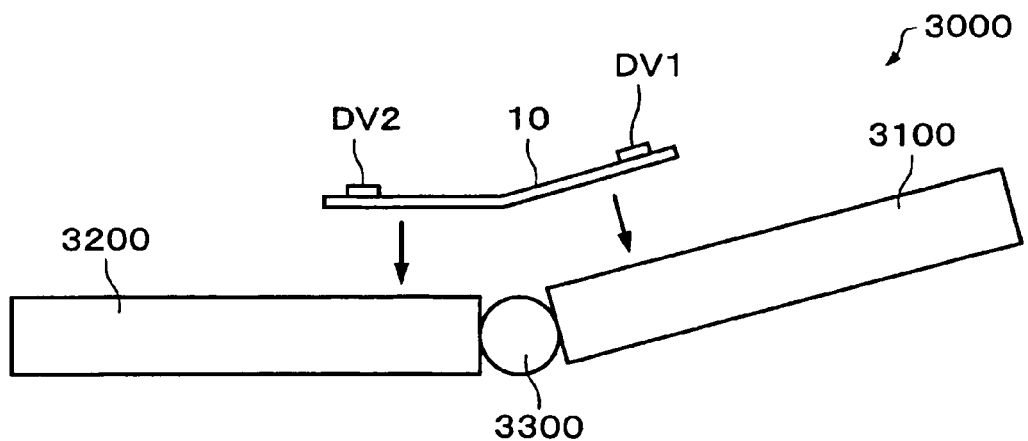
FIG. 26 is a schematic side view of the electronic equipment shown in FIG. 25.

FIG. 26 is a schematic side view of the electronic equipment 3000 shown in FIG. 25 when seen from the direction DR9.

For example, when the flexible substrate 10 is built in the electronic equipment 3000, the first part AR1, where the first device DV1 is provided, of the flexible substrate 10 may be included in the first equipment part 3100 of the electronic equipment 3000. Moreover, the second part AR2, where the second device DV2 is provided, of the flexible substrate 10 may be included in the second equipment part 3200 of the electronic equipment 3000. In addition, the wiring part AR3 may be included in the coupling part 3300.

Figure 27:
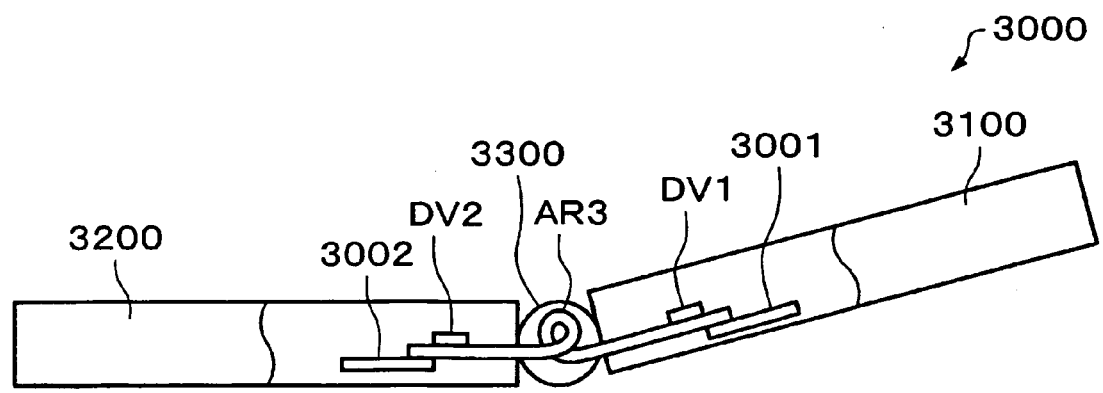
FIG. 27 is a side view partly showing electronic equipment provided with a flexible substrate.

FIG. 27 is a side view partly showing the cross-section surface of the electronic equipment 3000 provided with the flexible substrate 10.

The first equipment part 3100 is provided with a first substrate 3001. The first substrate 3001 is coupled to the first terminal P1 of the flexible substrate 10. In the same manner, the second equipment part 3200 is provided with a second substrate 3002. The second substrate 3002 is coupled to the second terminal P2 of the flexible substrate 10. As shown in FIG. 27, the wiring part AR3 may be rolled once, for example, so as to be fitted in the coupling part 3300. Since the wiring part AR3 is a flexible substrate, it is flexible enough to be fitted as shown in FIG. 27. Also, the wiring part AR3 can be twisted. Alternatively, the flexible substrate 10 may be built in the electronic equipment 3000 without rolling or twisting the wiring part AR3.

While the coupling part 3300 is made of moving parts so that the electronic equipment 3000 shown in FIG. 25 can be folded around the coupling part 3300, this is not intended to limit the structure. Also, while the first equipment part 3100 is provided with the display panel 3400, the first equipment part 3100 may not include the display panel 3400.

Figure 28:
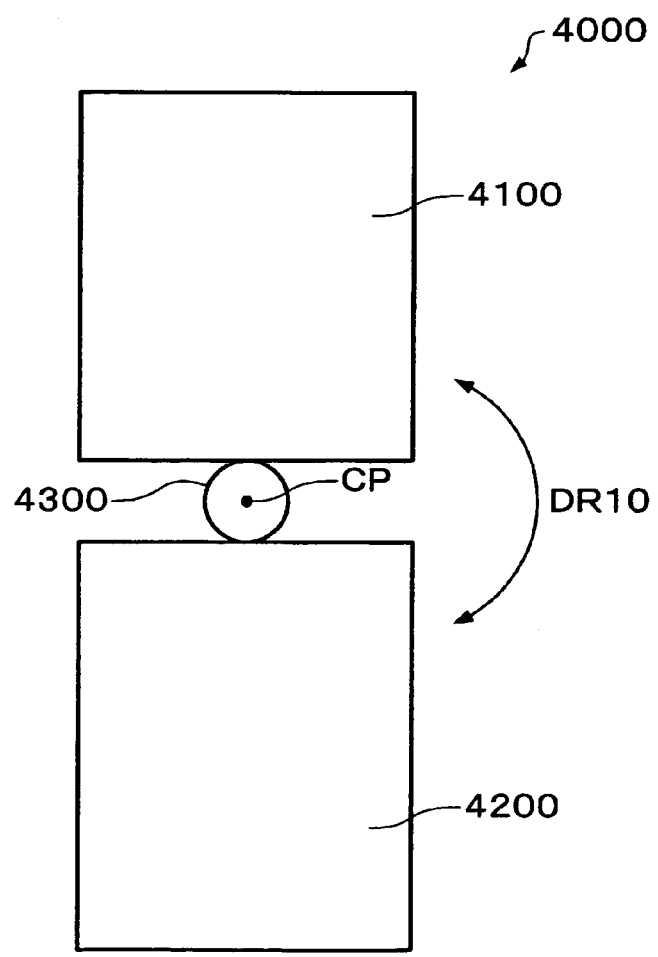
FIG. 28 is an overall view schematically showing another piece of small-sized electronic equipment equipped with a display panel.
Figure 29:
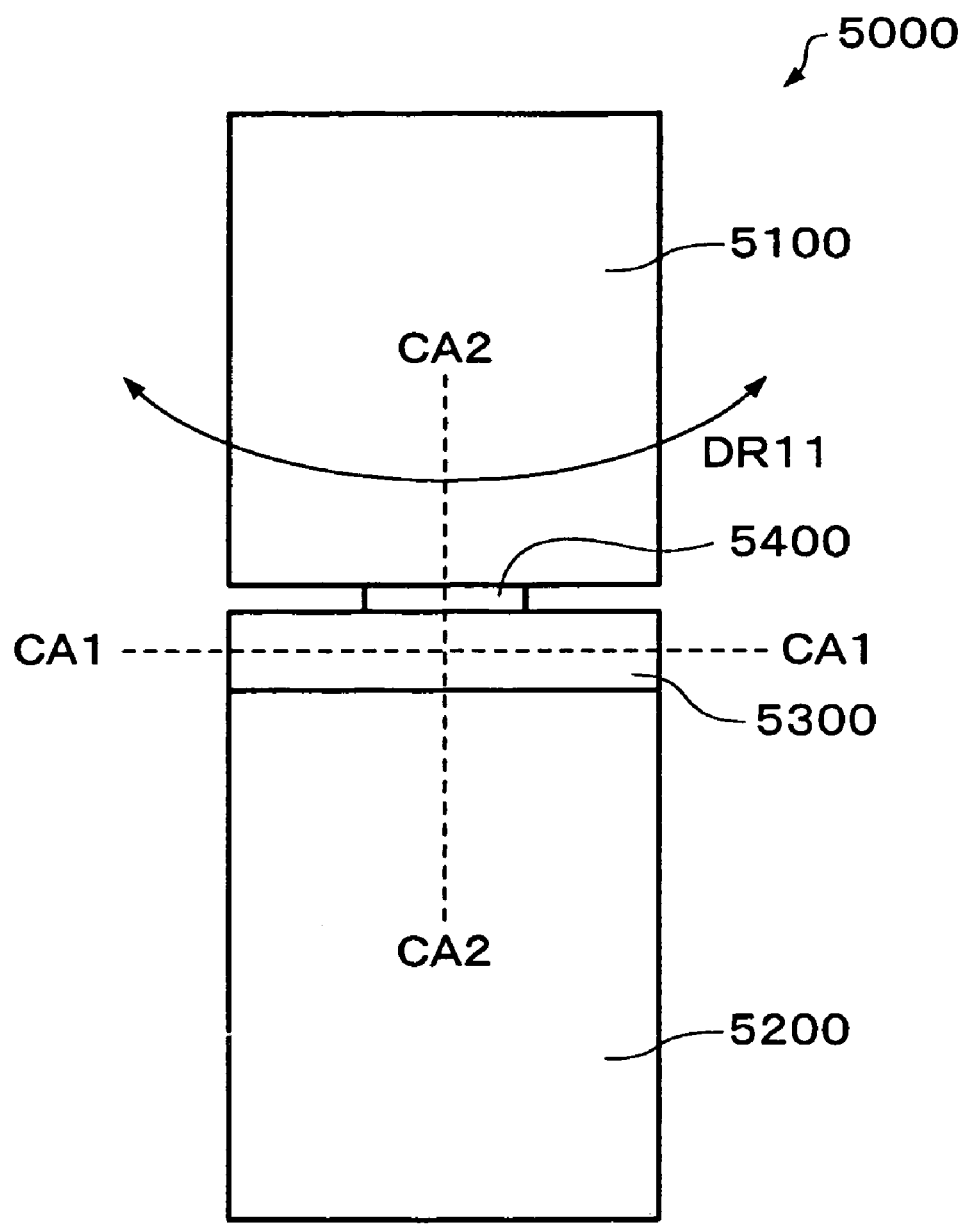
FIG. 29 is an overall view schematically showing another piece of small-sized electronic equipment equipped with a display panel.

As mentioned above, the electronic equipment 3000 can be folded around the coupling part 3300. The flexible substrate 10 of the present embodiment and its modifications, the flexible substrates 30 to 70, etc., are also applicable to electronic equipment having a different shape of the coupling part 3300. Examples of applications are given below. In FIGS. 28 and 29, detailed components, such as operational buttons, of electronic equipment are not shown.

Referring to FIG. 28, electronic equipment 4000 includes a first equipment part 4100, a second equipment part 4200, and a coupling part 4300.

The first equipment part 4100 or the second equipment part 4200 is rotatable around a center MP of the coupling part 4300 in the direction DR10. With this structure of the electronic equipment, a room in the coupling part 4300 for accommodating the wiring part AR3 is extremely limited. The flexible substrate 10 of the present embodiment and its modifications, the flexible substrates 30 to 70, can also be built in the electronic equipment 4000. For example, the first equipment part 4100 of the electronic equipment 4000 is provided with the first part AR1 of the flexible substrate 10, and the second equipment part 4200 of the electronic equipment 4000 is provided with the second part AR2 of the flexible substrate 10. The coupling part 4300 of the electronic equipment 4000 is provided with the wiring part AR3 of the flexible substrate 10.

Referring to FIG. 29, electronic equipment 5000 includes a first equipment part 5100, a second equipment part 5200, a coupling part 5300 and a coupling part 5400.

The first equipment part 5100 or the second equipment part 5200 can be folded around the coupling part 5300 in the same manner as the electronic equipment 3000 shown in FIG. 25. More specifically, the first equipment part 5100 and the second equipment part 5200 can be folded around a center axis CA1 of the coupling part 5300. Furthermore, the first equipment part 5100 is rotatable around a center axis CA2 of the coupling part 5400 in the direction DR11. With this structure of the electronic equipment in which the plurality of coupling parts 5300 and 5400 are provided, a room for accommodating the wiring part AR3 is extremely limited. The flexible substrate 10 of the present embodiment and its modifications, the flexible substrates 30 to 70, can also be built in the electronic equipment 5000. For example, the first equipment part 5100 of the electronic equipment 5000 is provided with the first part AR1 of the flexible substrate 10, and the second equipment part 5200 of the electronic equipment 5000 is provided with the second part AR2 of the flexible substrate 10. The coupling parts 5300 and 5400 of the electronic equipment 5000 are provided with the wiring part AR3 of the flexible substrate 10, for example.

As mentioned above, the wiring part AR3 included in the flexible substrate 10 of the present embodiment and its modifications, the flexible substrates 30 to 70, can be built in a coupling part including a moving part in various types of electronic equipment.

While data is transferred using differential signals in the flexible substrate 10 of the present embodiment and its modifications, serial data may be transferred by a single-ended method in another modification. More specifically, a unit that transmits data generates a signal with a constant current source, and transmits the signal to a unit that receives data via a single signal line, for example. Upon receiving the transmitted signal, the unit that receives data converts the signal into a voltage, compares the voltage with a reference voltage, and outputs a comparison result as a logical-level signal. The flexible substrate of the present embodiment is applicable to this case, in which signals generated by a single-ended data transfer control unit are transmitted. In this case, a single-ended data transfer control unit is provided to the first device DV1 of the first part AR1 and the second device DV2 of the second part AR2 included in the flexible substrate. Even if the single-ended data transfer control unit is provided, the flexible substrate of the present embodiment can reduce signal degradation. Furthermore, it is possible to reduce the number of signal lines, and thereby increasing the versatility of designing the wiring part AR3.

The present invention is not limited to the description of the above-mentioned embodiment, and various changes can be made. For example, terms referred as broader or equivalent terms in the specification and drawings can replace corresponding terms in other parts of the specification and drawings.

What is claimed is:

1. A flexible substrate, on which a device is mounted, comprising:
   a first part provided with a first device;
   a second part provided with a second device; and
   a wiring part placed between the first part and the second part and including a plurality of wirings for coupling the first device and the second device;
   the first device including at least a first data transfer control unit,
   the second device including at least a second data transfer control unit,
   the first data transfer control unit and the second data transfer control unit transferring data by using a differential signal, and
   the plurality of wirings included in the wiring part for coupling the first device and the second device including at least one differential signal line pair for transferring data by using a differential signal, wherein
   the plurality of wirings include the differential signal line pair in a plural number,
   assuming that a direction in which the plurality of wirings for coupling the first device and the second device extend is a first direction,
   an insulator extends in the first direction in the wiring part,
   the plurality of wirings are provided on the insulator,
   a second conductor extends in the first direction between the differential signal line pair provided in a plural number on the insulator, and
   a plurality of signal lines other than the first differential signal line and the second differential signal line included in the differential signal line pair are provided below the insulator on a side the plurality of wirings are not provided.

2. The flexible substrate according to claim 1, wherein
   assuming that a direction in which the plurality of wirings for coupling the first device and the second device extend is a first direction,
   the wiring part includes a first conductor extending in the first direction in a lower layer of the wiring part, an insulator extending in the first direction in a higher layer than the first conductor, and the plurality of wirings provided on the insulator.

3. The flexible substrate according to claim 2, wherein
   characteristic impedance determining parameters for determining characteristic impedance of a first differential signal line and a second differential signal line included in the differential signal line pair include a wiring width, wiring thickness, and wiring length of the first differential signal line and the second differential signal line, and a thickness and dielectric constant of the insulator; and
   at least one of the characteristic impedance determining parameters of the first differential signal line and the second differential signal line is set so as to match characteristic impedance of the first differential signal line and the second differential signal line and input-output impedance of at least one of the first device and the second device.

4. The flexible substrate according to claim 3, wherein
   the plurality of wirings include the differential signal line pair in a plural number,
   the differential signal line pair provided in a plural number is provided on the insulator, and
   a second conductor extends in the first direction between the differential signal line pair provided in a plural number on the insulator.

5. The flexible substrate according to claim 1, wherein
   assuming that a direction in which the plurality of wirings for coupling the first device and the second device extend is a first direction,
   the wiring part includes a third conductor extending in the first direction in a lower layer of the wiring part, an insulator extending in the first direction in a higher layer than the third conductor, a fourth conductor extending on the insulator, and the plurality of wirings provided in the insulator.

6. The flexible substrate according to claim 5, wherein
   characteristic impedance determining parameters for determining characteristic impedance of a first differential signal line and a second differential signal line included in the differential signal line pair include a wiring width, wiring thickness, and wiring length of the first differential signal line and the second differential signal line, and a thickness and dielectric constant of the insulator; and
   at least one of the characteristic impedance determining parameters of the first differential signal line and the second differential signal line is set so as to match characteristic impedance of the first differential signal line and the second differential signal line and input-output impedance of at least one of the first device and the second device.

7. The flexible substrate according to claim 1, wherein
   each of the plurality of signal lines is wired to the insulator so as to be placed below the second conductor.

8. The flexible substrate according to claim 1, wherein
   at least one of the first device and the second device includes a variable input-output impedance circuit that makes input-output impedance of at least one of the devices variable in accordance with characteristic impedance of the differential signal line pair.

9. The flexible substrate according to claim 8, wherein the variable input-output impedance circuit includes an impedance setting register in which impedance setting information is written, and
   the variable input-output impedance circuit sets input-output impedance of at least one of the devices based on impedance setting information in the impedance setting register.

10. The flexible substrate according to claim 1, wherein
    other devices than the data transfer control units are integrated in at least one of the first device and the second device.

11. The flexible substrate according to claim 1, further comprising:
    a first terminal coupled to a first device signal line that is coupled to the first device; and
    a second terminal coupled to a second device signal line that is coupled to the second device.

12. The electronic equipment, comprising:
    the flexible substrate according to claim 11;
    a first substrate coupled to the first terminal included in the flexible substrate; and
    a second substrate coupled to the second terminal included in the flexible substrate.

13. Electronic equipment, comprising:
the flexible substrate according to claim 11; and
a substrate provided with a coupling part coupled to the first terminal and another coupling part coupled to the second terminal.

14. An electronic equipment, comprising:
the flexible substrate according to claim 1;
a first equipment part provided with the first part included in the flexible substrate; and
a second equipment part provided with the second part included in the flexible substrate.

15. The electronic equipment according to claim 14, further comprising:
an equipment coupling part for coupling the first equipment part and the second equipment part,
the equipment coupling part provided with the wiring part included in the flexible substrate.

16. Electronic equipment, comprising:
a substrate;
a first data transfer control unit provided on the substrate;
a second data transfer control unit provided on the substrate;
a first differential signal line pair and a second differential signal line pair that transfers data from the first data transfer control unit to the second data transfer control unit, the first differential signal line pair and the second differential signal line pair provided on a first side of the substrate;
a first conductor provided between the first differential signal line pair and the second differential signal line pair; and
a plurality of signal lines provided on a second side of the substrate.

17. Electronic equipment, comprising:
a substrate;
a first data transfer control unit provided on the substrate;
a second data transfer control unit provided on the substrate;
a first differential signal line pair and a second differential signal line pair that transfers data from the first data transfer control unit to the second data transfer control unit, the first differential signal line pair and the second differential signal line pair provided on a first side of the substrate;
a first conductor provided between the first differential signal line pair and the second differential signal line pair; and
a plurality of signal lines provided on a second side of the substrate,
wherein the first differential signal line pair and the second differential signal line pair are on a different side of the substrate than the plurality of signal lines.

18. Electronic equipment, comprising:
a substrate;
a first data transfer control unit provided on the substrate;
a second data transfer control unit provided on the substrate;
a differential signal line pair that transfers data from the first data transfer control unit to the second data transfer control unit, the differential signal line pair provided on the substrate;
a first terminal that outputs a first signal from the first data transfer control unit; and
a second terminal that outputs a second signal from the second data transfer control unit,
the first terminal is disposed at a first edge of the substrate, and
the second terminal is disposed at a second edge of the substrate.

* * * * *